(12) United States Patent
Clunn

(10) Patent No.: US 6,426,632 B1
(45) Date of Patent: *Jul. 30, 2002

(54) METHOD AND APPARATUS FOR TESTING AN AFCI/GFCI CIRCUIT BREAKER

(75) Inventor: Robert Henry Clunn, Richardson, TX (US)

(73) Assignee: George A. Spencer, Plano, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/561,400

(22) Filed: Apr. 28, 2000

Related U.S. Application Data

(63) Continuation-in-part of application No. 09/277,879, filed on Mar. 29, 1999, now Pat. No. 6,191,589, which is a continuation-in-part of application No. 09/280,335, filed on Mar. 29, 1999, now abandoned.

(51) Int. Cl.[7] ............... G01R 31/14; G01R 31/327; H02H 3/16; G06F 17/50
(52) U.S. Cl. ............... 324/509; 324/424; 361/42; 703/18
(58) Field of Search ............... 324/509, 424, 324/127, 158.1; 361/42; 703/18

(56) References Cited

U.S. PATENT DOCUMENTS

| | | | |
|---|---|---|---|
| 5,027,059 A | 6/1991 | deMontgolfier et al. | 324/127 |
| 5,459,630 A | 10/1995 | MacKenzie et al. | 361/45 |
| 5,642,052 A | 6/1997 | Earle | 324/556 |
| 5,747,980 A | 5/1998 | Gershen | 323/356 |
| 5,834,940 A | 11/1998 | Brooks et al. | 324/424 |
| 5,835,322 A | 11/1998 | Smith et al. | 361/42 |
| 5,982,593 A | 11/1999 | Kimblin et al. | 361/42 |
| 6,191,589 B1 * | 2/2001 | Clunn | 324/424 |

* cited by examiner

Primary Examiner—Diego Gutierrez
Assistant Examiner—Anjan K Deb
(74) Attorney, Agent, or Firm—Howison, Thoma & Arnott, L.L.P.

(57) ABSTRACT

There is disclosed and claimed herein apparatus and a method for testing an electronic circuit breaker having separable contacts and arc fault and/or ground fault interrupting capability responsive to differential currents in the line and neutral conductors, wherein the circuit breaker under test is connected in a test circuit, comprising the steps of: supplying operating power to the source terminals of the circuit breaker wherein the test circuit provides for connecting the neutral conductor source terminal to a ground in the test circuit; coupling testing signals from a test generator in the test circuit to the neutral conductor load terminal of the circuit breaker; and monitoring the condition of the separable contacts in the circuit breaker during the supply of testing signals to the neutral conductor load terminal. In one aspect, the test generator is operated under program control to provide a testing signal sequence to the neutral conductor load terminal of the circuit breaker, which sequence may include a command signal for setting a precondition in the circuit breaker prior to applying testing signals to the circuit breaker under test.

30 Claims, 11 Drawing Sheets

METHOD AND APPARATUS FOR TESTING AN AFCI/GFCI CIRCUIT BREAKER

CROSS REFERENCE TO THE RELATED APPLICATIONS

The present application is a Continuation-in-Part of U.S. patent application Ser. No. 09/277,879, filed Mar. 29, 1999 and entitled "Test Circuit for an AFCI/GFCI Circuit Breaker" now U.S. Pat. No. 6,191,589 issued Feb. 20, 2001 which is a Continuation-in-Part of U.S. patent application Ser. No. 09/280,335, filed Mar. 29, 1999 and entitled "Current Sensor" now abandoned and is related to U.S. Pat. No. 5,875,087 issued Feb. 23, 1999 and entitled "Circuit Breaker with Integrated Control Features.

TECHNICAL FIELD OF THE INVENTION

The present invention is related to electronic circuit breakers, and more particularly, to methods and devices for testing electronic circuit breakers capable of responding to arc fault and ground fault conditions.

BACKGROUND OF THE INVENTION

It has been estimated that a large percentage of the fires that occur in residential dwellings can be attributed to "arcing faults." An arc fault is an unintentional electrical discharge characterized by an erratic current that may ignite combustible materials. Two types of arc faults which may occur in household wiring include parallel and series arc faults. A parallel fault occurs when there is an arc resulting from direct contact of two wires of opposite polarity. A series fault occurs when there is an arc across a break in a single conductor. Parallel arcing typically occurs where there has been an insulation failure. Series arcs typically result from loose connections and the like. These situations are both outside of the normal range of protection provided by conventional electromechanical or thermal operating circuit breakers. To address this particular type of problem industry has developed the arc fault circuit interrupter (AFCI) technology now being utilized in electronic circuit breakers. A related technology developed to disable a power circuit in the event of a ground fault—typically an unintended leakage current path between a live circuit and a ground—is called a ground fault circuit interrupter (GFCI).

It is well known that electrical arcs are transient events which occur at random and often for very brief durations. Hazardous arcing events are of two kinds: those which result in very large peak currents but which do not trip a breaker because of the very short duration; and those which can result in very low currents but which are continuous in nature and likewise do not trip a circuit breaker. However, some transient events and arc events are non-hazardous such as the high transient current which typically accompanies the start up of a motor or a compressor, or, as often occurs in typical household wiring systems, the small arcs which often accompany the operation of light switches in the home.

Though technology has developed circuit breakers with the capability to distinguish hazardous from non-hazardous arcing and ground faults, testing this capability in production or in actual applications is very difficult because of the wide dynamic range and random nature of arc fault currents. Development of arc testing for circuit breakers has been impeded by the difficulty and/or high cost of generating complex, high current test waveforms at high voltages. What is needed are test devices and methods which operate at low power levels yet are able to simulate accurately and repeatably the properties of arcing faults. Preferably, such devices and methods would utilize the arc fault and ground fault technology built into electronic circuit breakers to provide such testing at a reasonable cost and as simply as possible.

SUMMARY OF THE INVENTION

There is disclosed and claimed herein apparatus and a method for testing an electronic circuit breaker having separable contacts and arc fault and/or ground fault interrupting capability responsive to differential currents in the line and neutral conductors, wherein the circuit breaker under test is connected in a test circuit, comprising the steps of: supplying operating power to the source terminals of the circuit breaker wherein the test circuit provides for connecting the neutral conductor source terminal to a ground in the test circuit; coupling testing signals from a test generator in the test circuit to the neutral conductor load terminal of the circuit breaker; and monitoring the condition of the separable contacts in the circuit breaker during the supply of testing signals to the neutral conductor load terminal. In one aspect, the test generator is operated under program control to provide a testing signal sequence to the neutral conductor load terminal of the circuit breaker, which sequence may include a command signal for setting a precondition in the circuit breaker prior to applying testing signals to the circuit breaker under test.

BRIEF DESCRIPTION OF THE DRAWINGS

For a more complete understanding of the present invention and the advantages thereof, reference is now made to the following description taken in conjunction with the accompanying Drawings in which:

FIG. 13b illustrates a binary signal detected in the circuit breaker under test corresponding to the command waveform of FIG. 13a;

DETAILED DESCRIPTION OF THE INVENTION

Current Sensor

Figure 1:
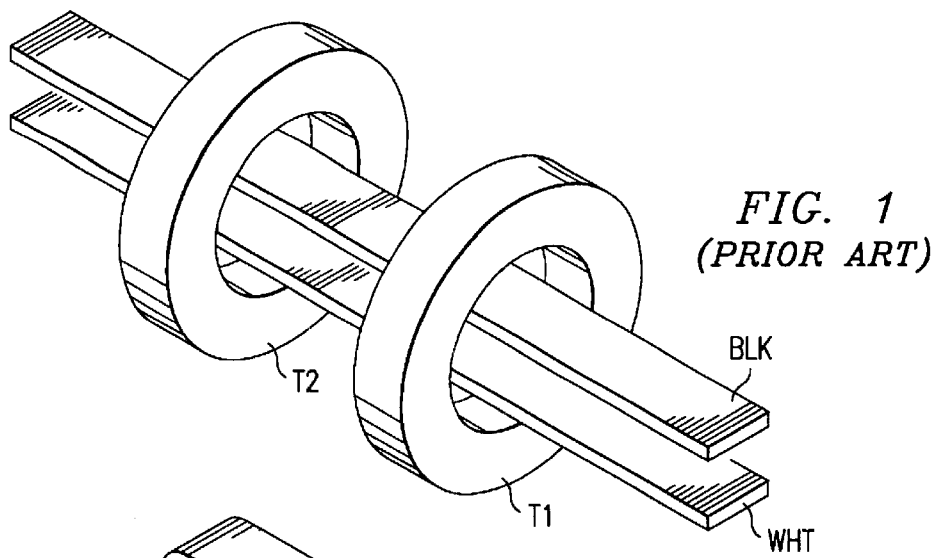
FIG. 1 illustrates a conventional GFCI sensor configuration where both conductors pass through a pair of toroidal cores.

Referring now to FIG. 1, there is illustrated a conventional ground fault circuit interrupter (GFCI) sensor configuration. Conventional GFCI circuit breakers are routinely manufactured with two heavy current-carrying mains conductors (BLK and WHT) passing through twin toroidal cores (of transformers T1 and T2). Although twin toroid transformers may be present, only one is used for the GFCI function. Transformer T1 detects leakage current in the GFCI mode, and has a turns ratio of approximately 1:1000. Transformer T2 supports neutral-to-ground short circuit detection by providing for injecting a signal detectable by T1 and typically has a turns ratio of approximately 200:1.

Figure 2:
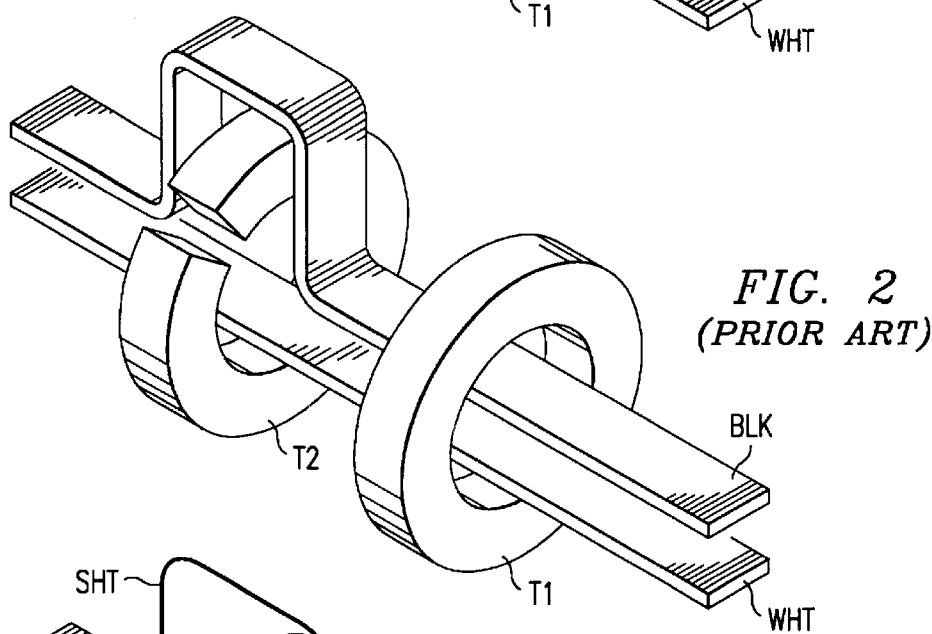
FIG. 2 illustrates a conventional AFCI/GFCI sensor configuration where one conductor loops around a toroid with an air gap.

Referring now to FIG. 2, there is illustrated a conventional AFCI/GFCI sensor configuration where one mains conductor does not pass through the toroid core, the toroid core having an air gap. The transformer T2 uses an air gap to prevent saturation at high currents. However, the lower signal output and narrower bandwidth (since the low frequency cutoff rises) in effect provides a differentiation function, which requires an extra stage at the detection process to integrate the detected signal.

Figure 3:
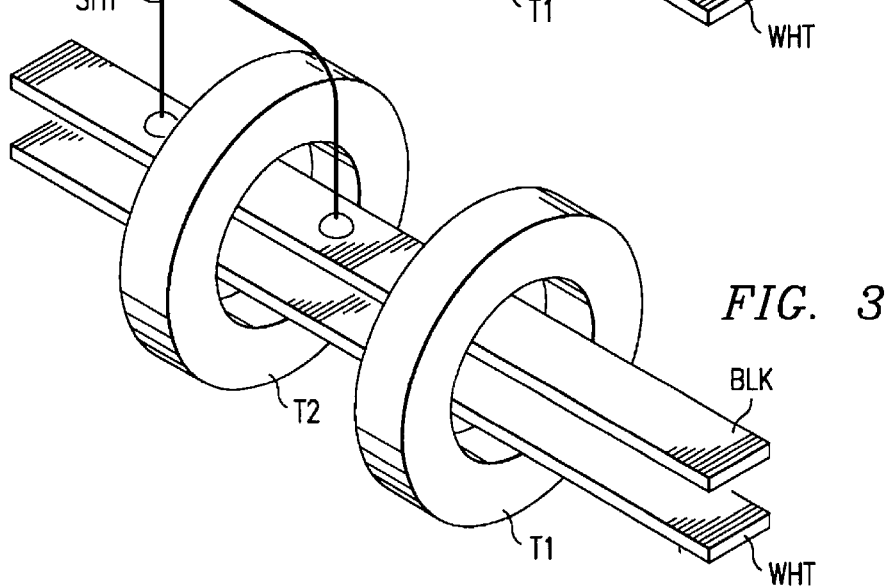
FIG. 3 illustrates a AFCI/GFCI sensor configuration having a B-Shunt, according to the disclosed embodiment.

Referring now to FIG. 3, there is illustrated a simple, but novel, modification to one of the current sensing transformers of FIG. 1. An improved current sensor is provided with the addition of the small gauge shunt conductor SHT (also called a B-Shunt) which is connected to one mains conductor to divert a small fraction of the current flowing in that mains conductor away from the load sensing transformer T2. The shunt conductor may be connected either to the hot wire (conductor BLK) or alternatively, to the neutral wire (conductor WHT), whichever is being tapped. The resistance in the shunt is greater than the resistance in either of the mains conductors (BLK and WHT), and therefore only a small amount of current is shunted around the toroid core. This small resistance shunt causes an imbalance of the currents in the conductors (BLK and WHT) through transformer T2 that is directly proportional to the load current. Therefore, the output of shunted current sensor is proportional to the load current. This unbalancing current flowing through the shunt conductor SHT is determined by the resistance ratio of the B-Shunt resistance to the resistance of the conductor to which it is attached, and may normally be substantially less than half of the current flowing in the load conductor. In the illustrative embodiment described herein, the shunt current typically may be on the order of 2–3% of the current flowing to the load. For example, where the transformer T2 has a turns ratio of approximately 1:1000, and the load current is 100amps, there may be 2–3 amps flowing in the B-Shunt, and the current in the secondary SEC of transformer T2 is then approximately 2–3 mA. This current is then converted to a proportional voltage by a terminating resistor from which a detection circuit reads the voltage. Therefore, this small fraction of diverted current provides a nearly linear and scaled-down, proportional sample from the net flux in the core of the transformer T2.

The shunt conductor SHT is approximately a 30–32 gauge copper wire and may be connected by some commonly known means (e.g., spot welded) to one of the mains conductors (BLK or WHT). Although the addition of this particular type of shunt conductor SHT may require an extra process step to spot weld each end of the shunt conductor SHT to one of the heavy mains conductors (BLK or WHT), the shunt conductor SHT can be made small since it is not required to carry a large amount of current. Therefore, the whole shunted current sensor assembly may be more compact than the configuration offered in FIG. 2.

Some benefits realized by the disclosed current sensing transformer embodiment are: the B-Shunt can be made from a small conductor since it does not carry high current; the shunted current sensor is easy to manufacture, since one of the conductors that carries a large current does not have to be bent in a complicated way to bypass transformer T2; and, the net flux flowing through transformer T2 is low enough such that the current sensed is nearly linear over a wide range of load currents.

Figure 4A:
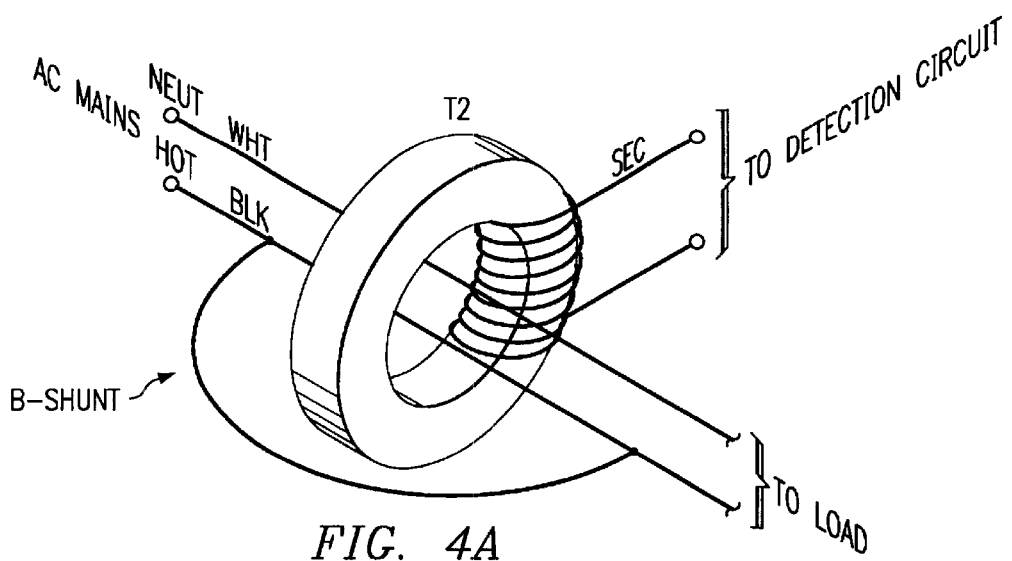
FIGS. 4A and 4B illustrate a physical implementation of a current sensor using a toroid transformer with the B-Shunt, and an equivalent circuit representation thereof, respectively.

Referring now to FIG. 4A, there is illustrated an arc fault detection sensor implementation. A pair of mains conductors (BLK and WHT) provide a forward and return path for current to a load. A single magnetic core (made of materials commonly known) provides the basis for a toroid transformer T2 which has both the mains conductors (BLK and WHT) extending therethrough. The B-Shunt conductor attaches at the first end to the hot conductor BLK and loops outside the magnetic core to bypass the toroid transformer T2 (and does not extend therethrough). The other end of the B-Shunt attaches again to the same conductor to which the first end is attached (in this case, conductor BLK). This connection electrically places the B-Shunt across the primary winding of the transformer T2. In this particular embodiment, a secondary winding SEC has approximately 1000 turns, and which according to the turns ratio couples a small sample of the load current to a detection circuit. It will be appreciated that, although this embodiment utilizes approximately 1000 turns for the secondary winding, the turns ratio is not that critical to overall operation of the arc fault detection function of the circuit breaker, and may be varied well above or below the 1000 turns used in this illustrative embodiment, according to preferred design considerations and economic considerations. The detection circuit, mentioned in greater detail hereinbelow, reads the sampled load current from across a detection resistor to process the sample parameter and operate the circuit breaker accordingly.

Figure 4B:
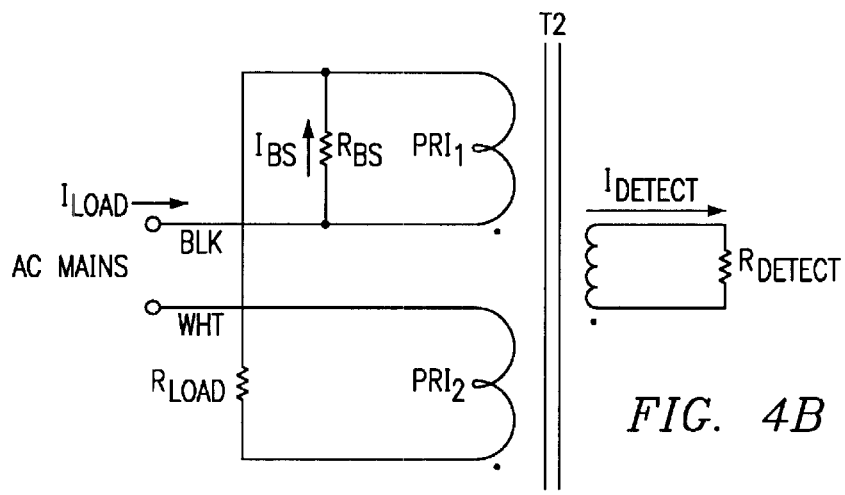

Referring now to FIG. 4B, there is illustrated a schematic diagram of a current sensing transformer according to the disclosed embodiment. There is shown a current sensing transformer T2 comprising twin primary windings ($PRI_1$ and $PRI_2$) and a secondary winding SEC, each wound on a magnetic toroidal core. The first primary winding $PRI_1$ consists of a single turn of the hot mains conductor and the second primary winding $PRI_2$ consists of a single turn of the neutral conductor. The B-Shunt, in the exemplary embodiment, comprises a small gauge wire, and is shown as a small shunt resistance $R_{BS}$ (typically on the order of 50 mΩ) connected to the hot conductor BLK and across the primary winding $PRI_1$. (The resistance value of the B-Shunt may vary considerably from the disclosed 50 mΩ according to the desired detection circuit designs.) Connected across the secondary winding SEC is a resistance $R_{DETECT}$ whose voltage is sampled by the detection circuitry (a function provided by a microprocessor control circuit mentioned hereinbelow). With this shunt resistance $R_{BS}$ in place, the load current $I_{LOAD}$ flowing in one conductor (the hot conductor BLK, in this particular embodiment) divides into two paths. Therefore, the current $I_{BS}$ through the shunt resistance $R_{BS}$ is only a small fraction of the total load current $I_{LOAD}$, perhaps on the order of 2% in this example. The net flux in transformer T2 is a function of the net current $I_{NET}$ defined in terms of the current in the hot conductor $I_{BLK}$ (which is also the load current $I_{LOAD}$), current in the neutral conductor $I_{WHT}$, and current flowing through the B-Shunt $I_{BS}$, where:

$$I_{NET}=(I_{BLK}-I_{BS})-I_{WHT}.$$

Since the net flux in transformer T2 is typically only about 2% of the load current $I_{LOAD}$, the transformer T2 core doesn't saturate, and the output of transformer T2 is a nearly linear signal proportional to the load current $I_{LOAD}$. Therefore, a sample of the load current $I_{LOAD}$ (shunt current $I_{BS}$) is coupled to the secondary SEC of transformer T2 according to the turns ratio. This secondary SEC load sample current $I_{DETECT}$ is then detected by the microprocessor control circuit across a resistance $R_{DETECT}$. This shunt conductor SHT can be connected to either the black BLK or the white WHT conductor with the same effect. Additionally, the phase of the transformer output can be changed simply by reversing the connections to the secondary winding SEC.

Figure 5:
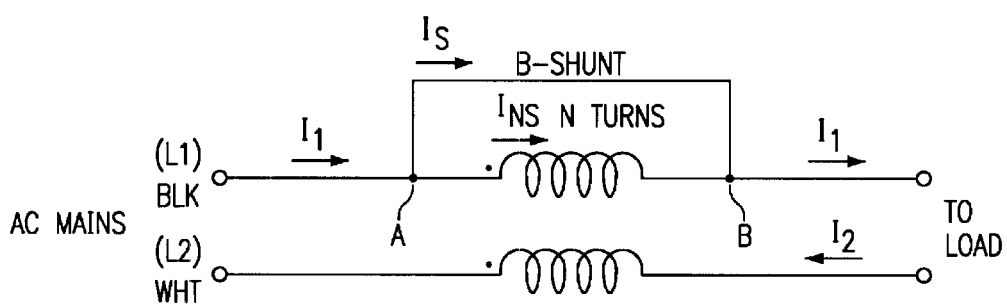
FIG. 5 illustrates an alternative embodiment wherein a magnetic core is not required.
Figure 5:
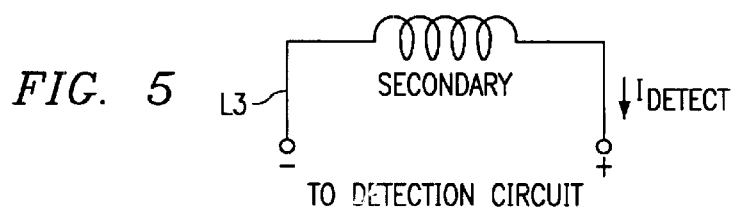

Referring now to FIG. 5, there is illustrated an alternative embodiment wherein a coreless (a core lacking magnetic material) current transformer coil L3 provides the coupling to the detection circuit. In this particular example, two conductors (L1 and L2, and also called BLK and WHT, respectively) provide the forward and return paths, respectively, for load current carried between an AC mains source and a load. A third conductor L3 is coiled around the two conductors (L1 and L2) forming a coil having a number of turns N to couple any current differential detected between the two conductors (L1 and L2) to a detection circuit. The B-Shunt bypasses the coil L3 by connecting external to the coil $L_3$ between Nodes A and B on the hot conductor L1. The load current $I_1$ on the hot conductor L1 reaches Node A and splits according to the resistance of the B-Shunt relative to the resistance of the hot conductor L1. As mentioned hereinabove, the resistance of the B-Shunt conductor is typically very small (on the order of 50 mΩ), yet large relative to the resistance of the conductor to which it is attached. Therefore, only a very small portion of the load current is diverted through the B-Shunt. The shunt current $I_S$ passes through the B-Shunt, and the remaining not-shunted current $I_{NS}$ passes through the hot conductor L1 to Node B where the currents recombine to the load. To represent the current in the secondary of the coreless transformer, $$I_{DETECT}=(I_1-I_{NS})/N,$$

where $I_1=I_2=I_S+I_{NS}$; $I_S=I_1/r$; N=number of turns of conductor L3; and $r=R_{BS}/R_{AB}$, where $R_{BS}$ is the resistance of the B-Shunt between Nodes A and B, and $R_{AB}$ is the resistance of the conductor L1 between Nodes A and B. It can appreciated that the coil L3 may be readily wound around a non-magnetic material such as a plastic coil form for manufacturing and installation purposes.

Figure 6A:
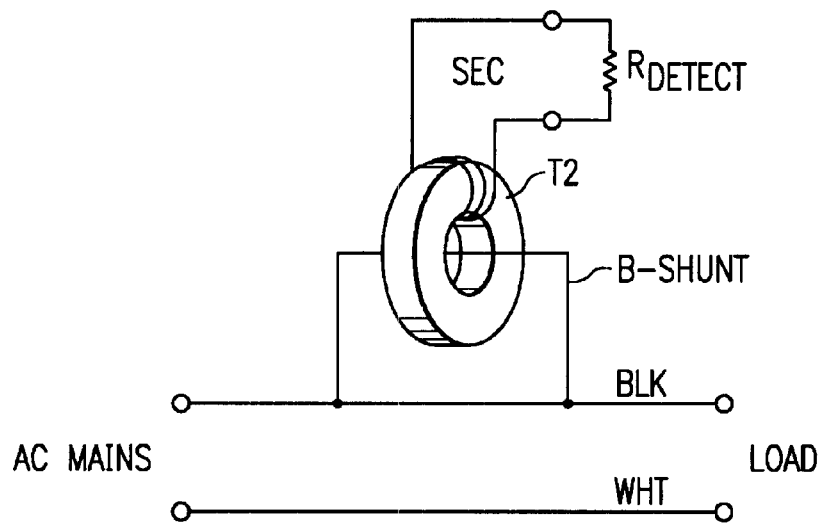
FIGS. 6A and 6B illustrate an alternative embodiment where the B-Shunt alone is passed through the current sensor transformer core.

Referring now to FIG. 6A, there is illustrated an alternative embodiment using the B-Shunt. As can be differentiated from FIGS. 4A and 5, in this particular embodiment, the AC mains conductors (BLK and WHT) do not pass through the toroid core. Instead, the B-Shunt passes through the toroid core. As mentioned hereinabove, the B-Shunt may also be applied to the neutral conductor WHT to obtain similar results. The transformer T2 has a secondary winding SEC across which is connected a detect resistance $R_{DETECT}$. A control circuit detects the voltage across this resistance and responds according to programmed instructions. This configuration offers the option of locating the transformer T2 away from transformer T1 (if T1 is provided in the particular circuit breaker), which may provide a more cost effective manufacturing approach. Since the mains conductors (BLK and WHT) are not passed through the toroid core (the manufacturing processes perhaps no longer driving the location of the transformer T2), the transformer T2 can be placed in a more space-accommodating location on, for example, a circuit board which may be used in the circuit breaker.

Figure 6B:
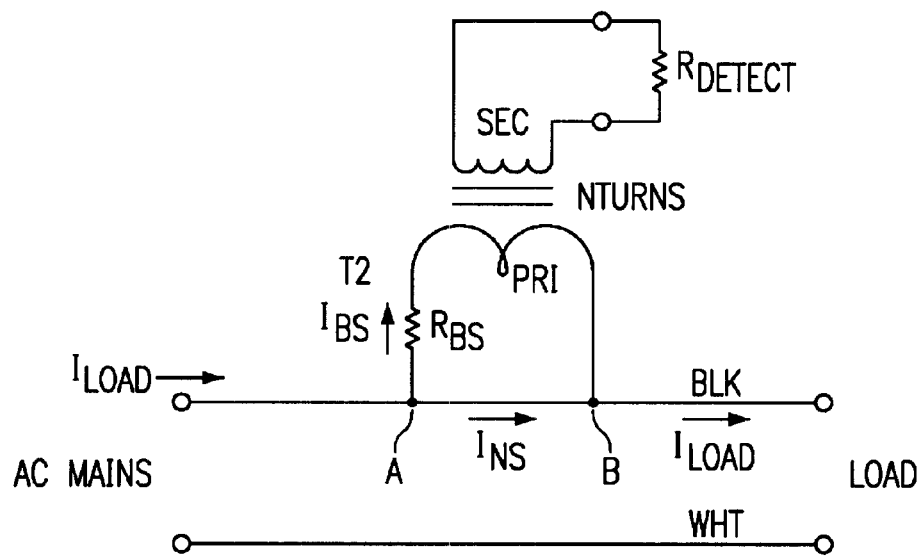

Referring now to FIG. 6B, there is illustrated an electrical circuit representation of the physical circuit of FIG. 6A. The B-Shunt resistance $R_{BS}$ is shown in series with a single-turn primary PRI. The load current $I_{LOAD}$ splits into the B-Shunt current $I_{BS}$ and the not-shunted load current $I_{NS}$ at Node A. Again, as mentioned hereinabove, the amount of current diverted through the B-Shunt is in proportion to the resistance of the B-Shunt $R_{BS}$ and the conductor BLK resistance between Nodes A and B. Typically, the B-Shunt resistance is very small, but larger relative to the conductor BLK resistance between Nodes A and B. The turns ratio N from the primary PRI to the secondary SEC can be varied according to design needs, and is not a critical aspect.

It can be appreciated that the implementation disclosed in FIG. 5 may be applied to the configuration of FIG. 6A, wherein a coreless winding may be used to couple the shunted current to the detection circuit.

Figure 7:
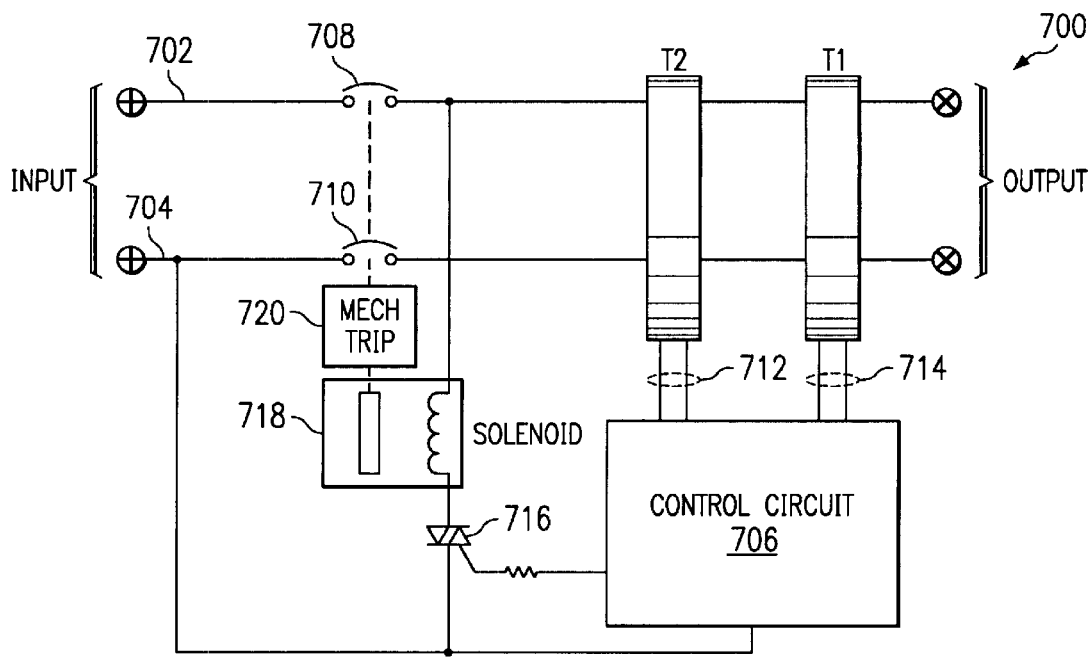
FIG. 7 illustrates a conventional GFCI circuit breaker.

Referring now to FIG. 7, there is illustrated a conventional GFCI circuit breaker. The circuit beaker 700 is built according to known electrical standards and houses two toroidal transformers, a transformer T1 for sensing leakage current between the hot lead and ground in ground fault protection mode, and a transformer T2 for use in sensing current in the arc fault detection mode. The net current through transformer T1 is zero unless there is a leakage path to ground. Mains conductors 702 and 704 (hot and neutral) receive source power from an AC mains and pass through transformers T1 and T2 so that a portion of the current may be monitored by a control circuit 706. Breaking elements 708 and 710 provide a method for breaking the circuit between the input and the output (the load) of the circuit breaker 700. Winding connections 712 and 714 from transformers T2 and T1, respectively, carry current sense signal to the control circuitry 706 in order for control circuitry 706 to react thereto and trip the breaker 700, if necessary. The control circuit 706 controls the gate current to a triac 716, and in overcurrent, leakage or arcing conditions, turns on the triac 716 in order to activate a solenoid 718 to trip the breaker 700. A mechanical trip switch 720 is included to allow manual tripping of the circuit breaker 700. The solenoid 718 also connects to activate the mechanical trip switch 720 such that the circuit breaker 700 is tripped when overcurrent, leakage or arcing conditions trigger the control circuit 706 to turn on the triac 716 and pull in the solenoid 718 to engage the mechanical trip switch 720.

Figure 8:
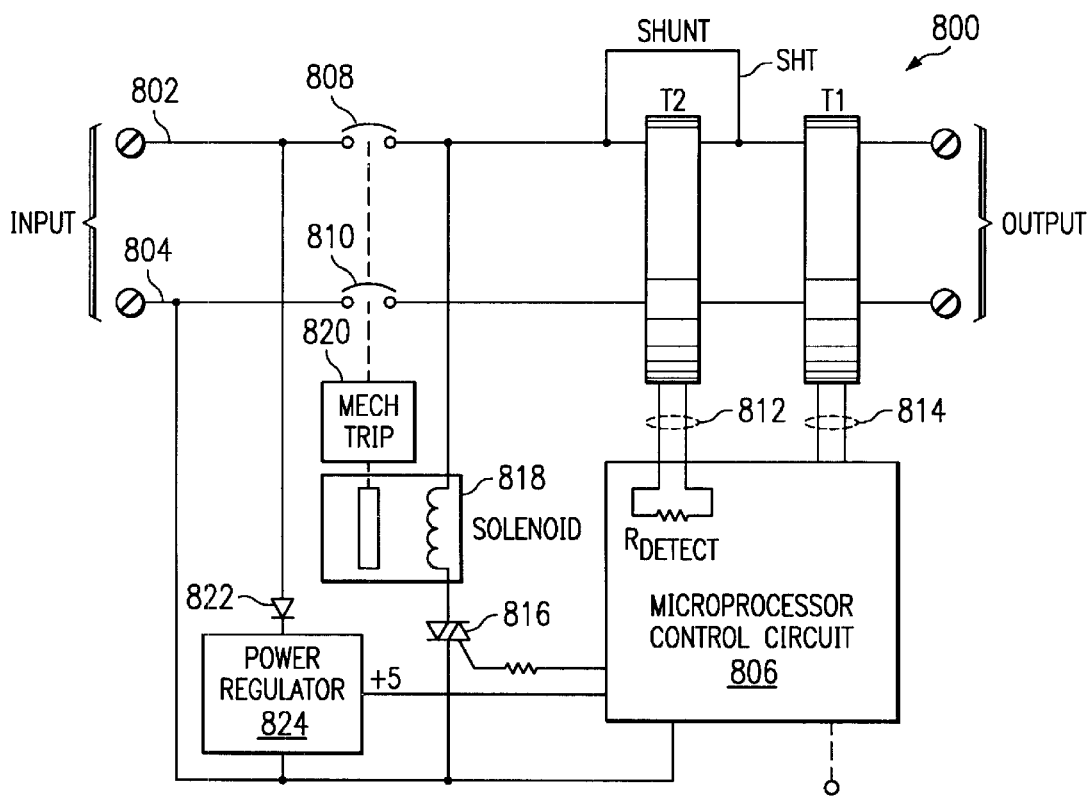
FIG. 8 illustrates an AFCI/GFCI circuit breaker having a current sensor according to the disclosed embodiment.

Referring now to FIG. 8, there is illustrated an AFCI/GFCI circuit breaker which uses the current sensor according to the disclosed embodiment. The circuit beaker 800 is built according to known electrical standards and houses two toroidal transformers, a transformer T1 for sensing leakage current between the hot lead and ground in ground fault protection mode, and a transformer T2 for sensing current in the arc fault detection mode. (Both transformers T1 and T2 are similar to those of FIG. 7.) Mains conductors 802 and 804 (hot and neutral, respectively) connect to receive source power from an AC mains and pass through transformers T1 and T2 so that a portion of the current may be monitored by a processor control circuit 806. The output of transformer T1 is amplified, and this amplifier has a linear output for up to approximately 25 mA of differential current between mains conductors 802 and 804. The net current through transformer T1 is zero unless there is a leakage path to ground.

Turning now to the arc fault detection circuit which uses transformer T2, a voltage $V_{DETECT}$ across a detect resistance $R_{DETECT}$ at the output of transformer T2 (at the secondary winding SEC) is proportional to the current $I_{BS}$ through the B-Shunt SHT. The microprocessor control circuit 806 detects this voltage $V_{DETECT}$ and compares the voltage value with stored predetermined operating limits in order to determine whether to disengage the breaking elements 808 and 810 to trip the breaker 800, or to allow the circuit breaker 800 to maintain the connection from the AC source to the load for normal operation. This voltage $V_{DETECT}$ is in essence a differential representation between the current in the hot conductor $I_{BLK}$ and the current in the neutral conductor $I_{WHT}$. Operation of an AFCI breaker is described in related U.S. Pat. No. 5,875,087 issued to the assignee of the present application, and incorporated by reference in its entirety herein. The microprocessor control circuit 806 may also, optionally, have an I/O port interface for communicating with external systems. For example, the microprocessor control circuit 806 may be programmed during a testing mode to turn on and turn off certain functions, or may receive updated programming information via the I/O port interface.

Breaking elements 808 and 810 provide a method for breaking the circuit between the input and the output of the circuit breaker 800. Winding connections 812 and 814 from transformers T2 and T1, respectively, carry a current representative of the mains current to processor control circuitry 806 in order for processor control circuitry 806 to react thereto and trip the breaker 800, if necessary. The processor control circuit 806 also controls the gate current to the triac 816, and in overcurrent or arcing conditions, turns on the triac 816 in order to activate a solenoid 818 to trip the breaker 800. A mechanical trip switch 820 is included to allow manual tripping of the circuit breaker 800. The solenoid 818 also connects to activate the mechanical trip switch 820 such that overcurrent or arcing conditions trigger the control circuit 806 to turn on the triac 816 and pull in the solenoid 818 to engage the mechanical trip switch 820 and trip the circuit breaker 800. The processor control circuit 806 is powered by a power circuit comprising a diode 822 and regulator 824. The power circuit converts the AC mains voltage to a 5-volt DC output for powering the processor control circuit 806.

Test Circuit

Testing circuit breakers with arbitrary complex waveforms can be complicated because of the high peak power that is normally required in the test waveforms. Conventional circuit breakers require that 120 volts AC be present across the two power conductors to supply DC power for the ground and arc fault detection electronics, and to power the solenoid used to trip the circuit breaker in the event of a fault. If testing waveforms require even a few tens of amps, the circuitry to generate such high power is very large and very expensive.

The more troublesome aspect of circuit breakers having AFCI technology is testing the arc fault detection circuitry in the circuit breaker. For example, it is difficult to duplicate the complex waveforms comprising arc events at full load currents under testing conditions during manufacture. Such duplication requires large and complex equipment not readily adaptable to assembly line applications. What is needed is an accurate, low cost, and efficient method to simulate such high current arcing conditions in an assembled circuit breaker containing arc fault detection circuitry.

The solution is provided by employing a novel current sensing transformer with a B-Shunt in the arc fault detection circuitry of the circuit breaker in combination with an external, low power test waveform generator connected to one of the terminals of the circuit breaker. The B-Shunt introduces a tremendous simplification in the testing procedure.

Figure 9:
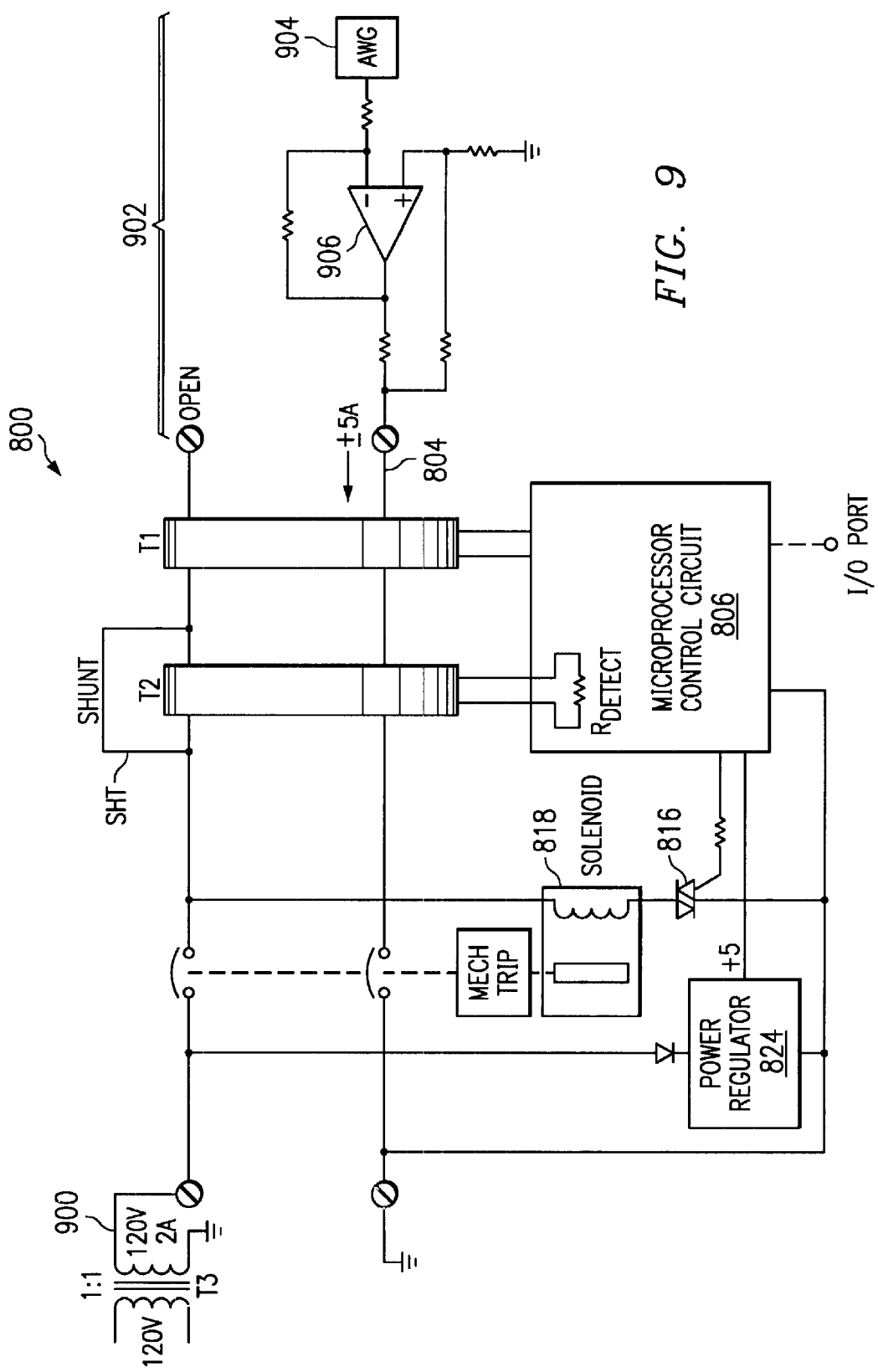
FIG. 9 illustrates a test configuration for testing the circuit breaker of FIG. 8 using the current sensor of the disclosed embodiment.

Referring now to FIG. 9, there is illustrated the circuit breaker of FIG. 8 in a low-power test configuration. The test configuration uses a transformer circuit 900 for powering the circuit breaker 800 during the test operation, and a signal generator circuit 902 for generating simulated arc fault waveforms. An arbitrary waveform generator (AWG) 904 is programmed to provide a variety of complex waveforms which simulate signals encountered by the breaker when in operation in the field. The output of the AWG 904 is input to a medium power amplifier 906 which programs the test waveforms with a high bit resolution and a bandwidth that covers the range of frequencies which the electronic circuitry in the arc detection mode will be detecting. The signal generation circuit 902 comprises, for example, an APEX model PA02 medium power amplifier 906 which outputs a low voltage bipolar 5 A signal to the neutral conductor 804. During the test of the arc fault detection circuitry, the output of the AWG 904 sends both a bit pattern to disable the ground fault circuit interrupting function (which uses transformer T1), and a test waveform which is a small replica of a full-scale load current arc fault. As mentioned hereinabove, the test waveform is sent at a low voltage level and a relatively low current level down one of the mains conductors (the neutral conductor 804, in this case) passing through the pair of toroid transformers T1 and T2. It will be appreciated that this test may be performed on a fully assembled circuit breaker 800 with the built-in power and both toroid transformers (T1 and T2) in place. (Thus one does not have to disassemble the circuit breaker 800 in order to provide this testing.) The special configuration of the circuit breaker 800 using transformer T2 with the B-Shunt allows low-voltage testing of the microprocessor control circuit 806 detection and trip functions through the injection of low current, low voltage complex waveforms which are representative of high current load arcing conditions.

The transformer circuit 900 comprises a 120 VAC isolation transformer T3 which supplies power for the electronic circuits in the circuit breaker 800 including the solenoid 818 used to trip the circuit breaker 800, the power regulator 824, and the microprocessor control circuit 806. The transformer T3, in this particular embodiment, has a turns ratio of approximately 1:1 with a 120 VAC/2A secondary winding power capability. (If desired, the voltage can be reduced to approximately 50–60 VAC for worst-case testing of the solenoid's ability to trip the breaker.) In any case, this power does not have to be turned on and off in a complex way, therefore a simple triac switch may be used to control the voltage provided by T3. Although the average power supplied by the transformer T3 is very small, it does have to provide approximately two amperes when the solenoid 818 is energized.

One of the conditions that must be accommodated while testing the current and arcing response of the circuit breaker 800 that has both the ground and arc fault detection capabilities is that the ground fault detection circuitry connected to its sensing transformer T1 will sense the very large imbalance in current flowing through that transformer T1. This large imbalance would normally be more than enough to cause the circuit breaker 800 to trip during testing due to a suspected ground fault. However, the ground fault circuit interrupting function can be easily disabled by programming a low level current of approximately 3 mA in a coded sequence and inserting the coded signal onto the mains conductor 804. The coded signal is then detected by the program in the microprocessor control circuit 806 in the circuit breaker 800. This allows the microprocessor control circuit 806 to disable the ground fault circuit interrupting function long enough to perform the high current test of the arc detection circuitry in the circuit breaker 800. For example, an 8-bit code pattern can be output in less than 600 milliseconds prior to each high current test. As mentioned hereinabove, if available, the I/O port of the microprocessor control circuit 806 may also be employed to momentarily disable the ground fault detection features during the testing phase.

A typical binary output pattern from the test waveform generator might be on the order of 1100 0101. This particular pattern has an equal number of 1's and 0's to eliminate offset effects caused by AC coupling of the ground fault circuit sensing transformer T1. Each "1" is encoded as four complete AC cycles with an amplitude of 3 mA. Correspondingly, each "0" is encoded as an interval of four cycles with zero current. The software overhead for this function is quite small and adds no cost to the completed circuit breaker 800. This technique is used to put the internal program of the microprocessor control circuit 806 into a special diagnostic mode when testing the arc fault and ground fault modes of the circuit breaker.

It should be appreciated that although the illustrative embodiments of the current sensor of the disclosed embodiment are disclosed for operation at power line frequencies, the current sensor of the disclosed embodiment may in principle also be employed in high frequency regimes.

An Alternate Test Circuit

Figure 10A:
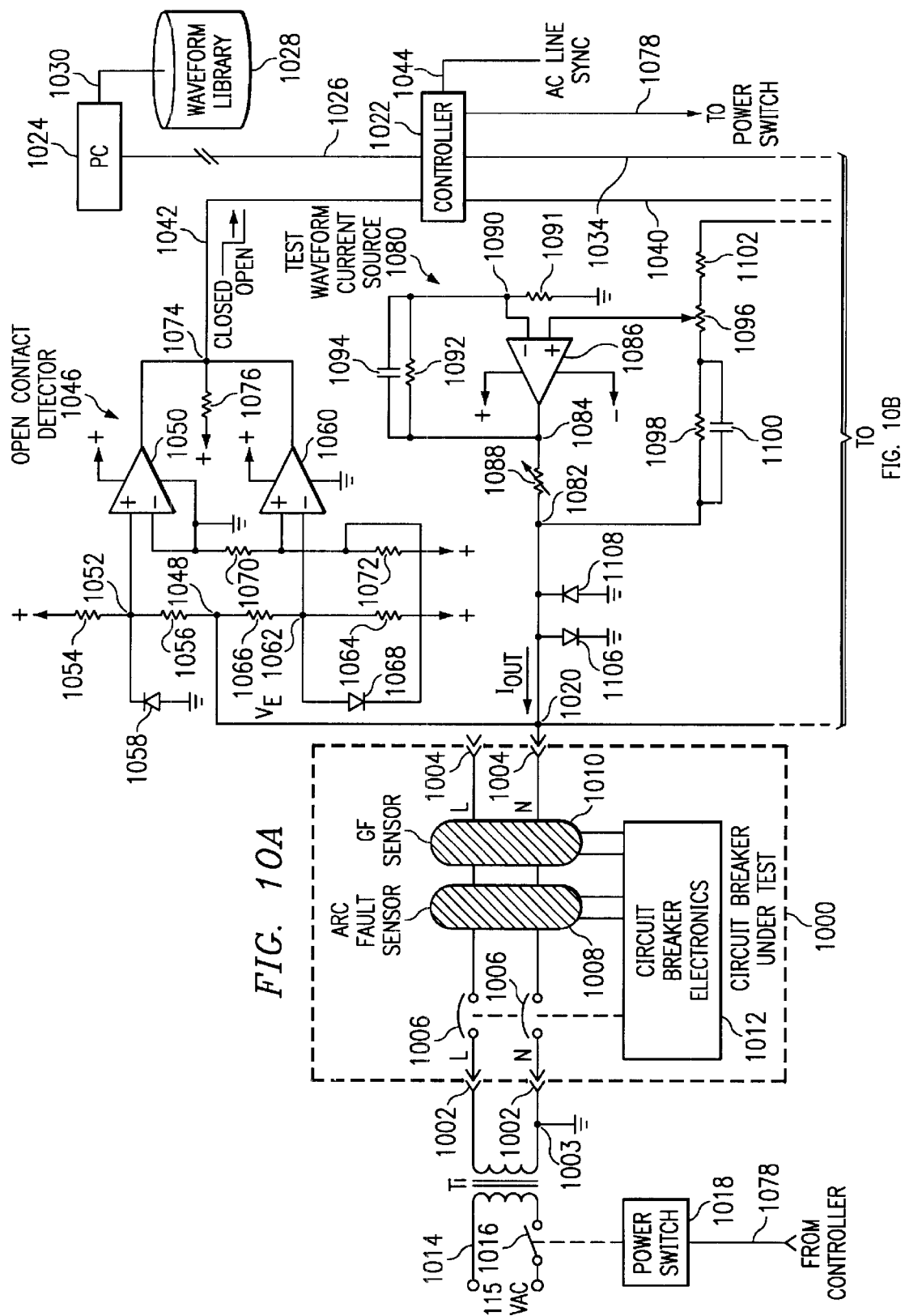
FIG. 10 illustrates a block diagram schematic of an alternate embodiment test circuit configuration for testing a circuit breaker as illustrated in FIG. 8 according to the present disclosure.
Figure 10B:
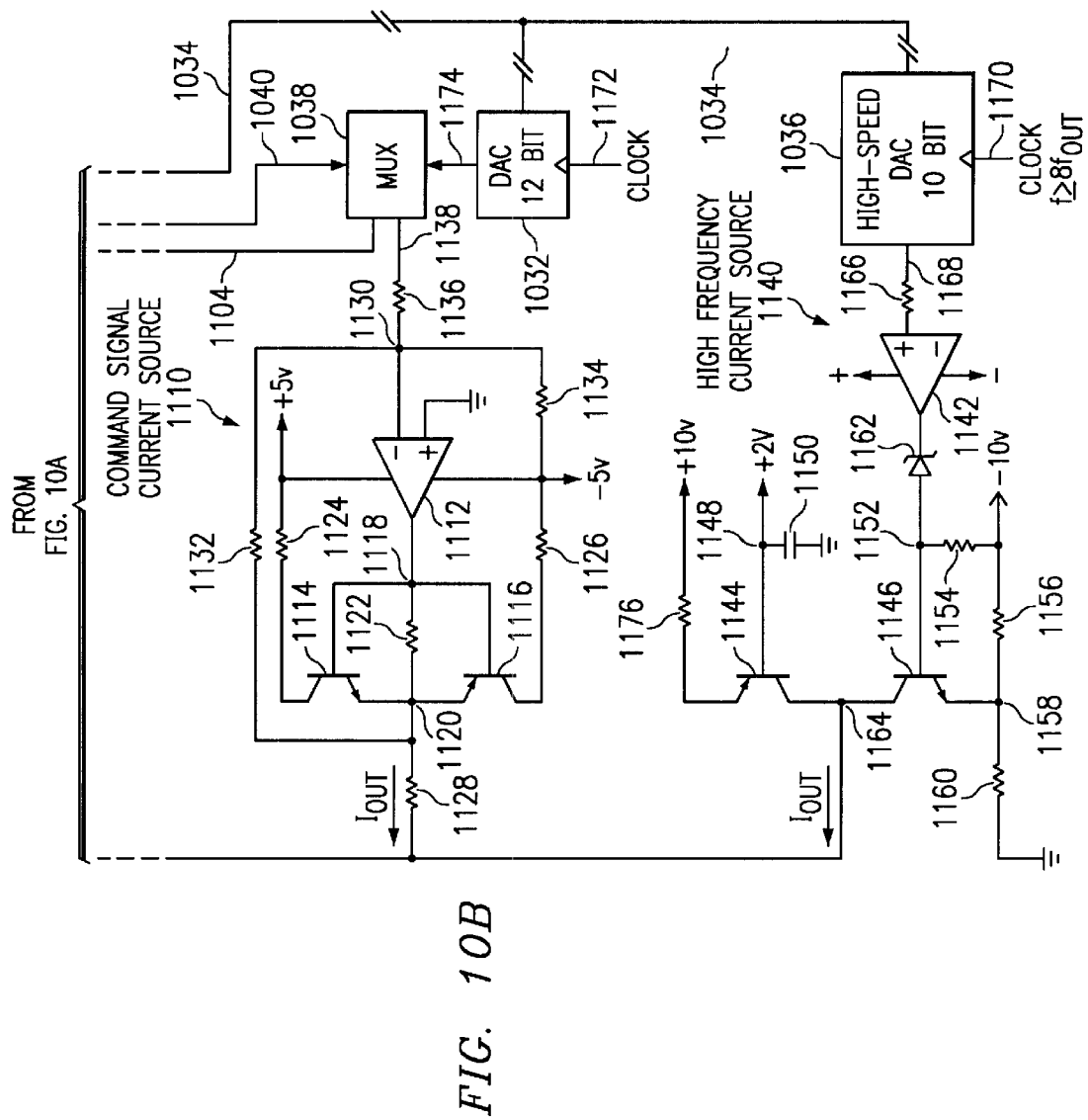

Referring now to FIG. 10, there is illustrated a block diagram schematic of an alternate embodiment test circuit configuration for testing an electronic circuit breaker as illustrated in FIG. 8. The circuit breaker under test 1000 is shown connected via pairs of terminals 1002 and 1004 to the test circuit shown in FIG. 10. The source terminals 1002 for the line and neutral lines of the power line in the circuit breaker 1000 shown coupled to the secondary of an isolation transformer 1014. The pair of terminals 1004 enable coupling the line and neutral load terminals of the circuit breaker under test 1000 respectively to corresponding terminals in the test circuit. In the embodiment shown in FIG. 10, the line terminal 1004 on the load side of the circuit breaker is not connected during a test for reasons that will become clear hereinbelow. The neutral conductor passing through the circuit breaker under test 1000 is coupled through a terminal 1004 to node 1020 in the test circuit. The circuit breaker under test 1000 includes the aforementioned line and neutral conductors which pass through respectively a set of separable contacts 1006 in each line and neutral conductor. The line and neutral conductors further pass through an arc fault sensor 1008 and also a ground fault sensor 1010. Both the arc fault sensor 1008 and the ground fault sensor 1010 are differential transformers as described in parent U.S. patent application Ser. No. 09/277,879 and entitled "Test Circuit for an AFCI/GFCI Circuit Breaker" and in parent U.S. patent application Ser. No. 09/280,335 entitled "Current Sensor." The particular details of each of these differential transformer sensors are described in the aforementioned co-pending patent applications. The circuit breaker under test 1000 also includes a block labeled circuit breaker electronics 1012 to which the outputs of both the arc fault sensor 1008 and the ground fault sensor 1010 are coupled for detection and processing of the detected signals picked up by the sensors 1008 and 1010. As also described in the aforementioned co-pending patent applications, the circuit breaker electronics 1012 provides a trip signal to operate the separable contacts to open the line and neutral conductors of the circuit breaker in the event that a current fault, an arc fault or a ground fault is detected. The test circuit also includes an isolation transformer 1014 having a power switch 1016 coupled in the primary circuit of transformer 1014. This power switch 1016 is operated by a circuit 1018 which receives a control signal along a line 1078 from a controller 1022 in the test circuit to be described hereinbelow.

Continuing with FIG. 10, a controller 1022 is coupled to a personal computer (PC) 1024 via a communication bus 1026 to provide control instructions and receive status information affecting the operation of the test circuit. The PC 1024 has coupled with it a database including a waveform library 1028 coupled along a bus 1030 to provide digitized waveform data for use in testing the circuit breaker under test 1000. Controller 1022 is further coupled to a 12 bit digital-to-analog controller (DAC) 1032 and to a high speed 10 bit DAC 1036 via a communication bus 1034. These digital-to-analog controllers 1032 and 1036 provide for converting digitized waveforms from the waveform library 1078 into analog form for processing by various circuits of the test circuit illustrated in FIG. 10. The outputs from the test circuit are applied to a summing point 1020 which is coupled through load terminal 1004 to the neutral conductor passing through the circuit breaker under test 1000. Controller 1022 is also coupled to an analog multiplexer (MUX) 1038 which is used to alternately switch signals from DAC 1032 to two of the test circuits in the test circuit of FIG. 10. It will be appreciated that the MUX 1038 connects the DAC 1032 to either the test waveform (high) current source 1080 or the command signal (low) current source 1110. Thus, both current sources 1080, 1110 are not active at the same time in this illustrative embodiment. The MUX 1038 is controlled along a signal path 1040 coupled from the controller 1022. Controller 1022 further includes an input for an AC line sync signal referred to the primary of isolation transformer 1014 and coupled to controller 1022 along a line 1044. Synchronizing both the controller 1022 and the PC with the AC line voltage that powers the circuit breaker under test ensures the repeatability of the test waveforms. Controller 1022 is also provided with an output along a line 1078 to control the power switch 1018 thereby providing on and off power control for the test circuit of FIG. 10.

Continuing with FIG. 10, the major elements of the processing circuitry within the test circuit will now be described. There are four essential processing circuits shown in FIG. 10. However, other implementations of the method and apparatus of the present disclosure may employ other numbers or other types of processing circuits in order to provide the testing regimen called for in a particular application. The four processing circuits in the illustrative embodiment include an open contact detector 1046, a test waveform current source 1080, a command signal current source 1110 and a high frequency current source 1140. The input to the open contact detector 1046 is coupled to the summing point at node 1020 and the output of the open contact detector 1046 is coupled to the controller 1022. The outputs of the remaining processing circuits are coupled to the summing point at the node 1020. Thus, each of these arbitrary waveform generators provide respective output current signals to the summing point node 1020 for testing the circuit breaker under test. Each of the current source circuits has an input coupled to and controlled by the controller 1022 as will be described hereinbelow.

Continuing now with FIG. 10, the summing point at node 1020 is coupled to a node 1048 representing the input to a pair of comparators having a common output at node 1074. The positive input of a comparator 1050 is coupled to a node 1052 which is coupled to the positive supply through a resistor 1054. Node 1052 is also coupled to the node 1048 through a resistor 1056 and to ground through a clamp rectifier 1058 having its cathode coupled to node 1052. The negative input of comparator 1050 is coupled to ground. The negative input of comparator 1060 is coupled to a node 1062 which is coupled to the common input node 1048 through a resistor 1066 and to the positive supply through a resistor 1064. The node 1062 is also coupled through a rectifier 1068 to the positive input of the comparator 1060 wherein the anode of rectifier 1068 is coupled to node 1062. The positive input of comparator 1060 is coupled to ground through a resistor 1070 and also to the positive supply through a resistor 1072. The outputs of both comparator 1050 and comparator 1060 are coupled directly to a common node 1074 which is coupled through a pull up resistor 1076 to the positive supply. Common node 1074 is also coupled to an input along a line 1042 to the controller 1022.

To understand the operation of the open contact detector 1046, reference is made to the ground connection 1003 at the neutral side of the secondary of power transformer 1014. This ground connection 1003 is located in the test circuit and provides for grounding the neutral conductor at the neutral conductor source terminal of the circuit breaker under test 1000. When the separable contacts 1006 of the circuit breaker under test 1000 are in a closed position, then node 1003 and node 1020 are connected together via the neutral conductor through the source terminals 1002, the load terminals 1004 and the circuit breaker under test 1000. Thus when the separable contacts 1006 of the test 1000 are in a closed position, the summing point at node 1020 is coupled to a ground at node 1003 in the test circuit. Thus, the voltage level at the node 1020 and correspondingly at the node 1048 will be at or very near the potential of the ground at node 1003. Under this condition, the outputs of both comparator 1050 and comparator 1060 will be pulled to a high logic level at node 1074. Detection of an open contact (i.e., of separable contacts 1006) occurs when the voltage at node 1020 exceeds a threshold set by the clamping rectifiers 1106 and 1108. This threshold is approximately one volt with respect to ground in the test circuit (node 1003) in this illustrative example. The rise in the voltage at node 1020 occurs because the load on the current source output driving node 1020 suddenly becomes open circuited when the separable contacts 1006 open in response to the test current injected at the summing point node 1020. Further, this voltage will be above or below the ground level depending on the polarity of particular signals that have been injected into the summing point at node 1020 during the test of a circuit breaker under test 1000. When the voltage at node 1048 rises above or below ground then one or the other of the comparators, 1050, 1060 changes state at its output and causes the node at 1074 to go low. The corresponding logic low is applied along line 1042 to controller 1022 to indicate that the circuit breaker contacts 1006 have opened in response to some condition sensed by the sensors within the circuit breaker under test 1000.

Continuing with FIG. 10, provision is made for supplying three kinds of testing signals to the summing point at node 1020. In a typical testing signal sequence, a command signal provided by the command signal current source 1110 precedes a test waveform from the test waveform current source 1080 or a high frequency test waveform from the high frequency current source 1140. The particular sequence of testing signals is controlled by a program running in the PC 1024 in this particular embodiment although the program could as easily be included in a routine executed by the controller 1022. The program for operating the test circuit will be described in detail hereinbelow in conjunction with FIGS. 11 and 12. Each of these current sources 1080, 1110 and 1140 will be recognized by those skilled in the art as arbitrary waveform generators which may be configured to output a current waveform of a particular predetermined configuration in order to facilitate the testing that is intended. To take advantage of the differential properties of the current or arc fault sensors in the circuit breaker under test 1000 it is only necessary to inject a testing signal into one of the line or neutral conductors. Further, injecting the testing signals into the neutral conductor provides a natural summing point at ground potential, enabling the use of low voltage testing signals. Thus it is preferred to inject the testing signals into the neutral conductor and leave the line conductor unconnected. Operating the test circuit at such low voltage test waveforms provides a substantial (e.g., 20:1 or 30:1 nominally) reduction in the power levels of the testing signals which, in combination with the approximately 10:1 reduction in currents sensed by the differential sensors reduces the overall power levels required for testing in excess of 100:1.

The test waveform current source 1080 provides for generating a relatively high current waveform under the control of the controller 1022. The test waveform consists of a string of digitized waveform samples coupled from the controller 1022 through the 12 bit DAC 1032, the MUX 1038 and line 1104 to the positive input of an operational amplifier 1086 via resistor 1102 and potentiometer 1096. The operational amplifier 1086 is connected as a true current source, that is, the output current will be accurate despite the small voltage rise at the summing point 1020 due to the high current flowing in the neutral conductor circuit. The op amp 1086 may be, in this example, a type OPA 541. The waveform signal is tapped off potentiometer 1096 by the wiper of potentiometer 1096 connected to the positive input of amplifier 1086. The negative input of amplifier 1086 is coupled to a node 1090 which is coupled to ground through a resistor 1091. The output of amplifier 1086 is coupled to a node 1084 which is coupled through a variable resistance 1088 to node 1082. The variable resistance 1088 may comprise a group of power resistors connectable in parallel which may be selected individually or in various combinations to provide a particular current level at the output node 1082. Node 1084 is coupled to node 1090 at the negative input of amplifier 1086 through the parallel combination of a resistor 1092 and a capacitor 1094 to provide for negative feedback and control of the frequency response of the amplifier 1086. Node 1082 is similarly coupled through a parallel combination of resistor 1098 and capacitor 1100 and then through potentiometer 1096 to complete the feedback circuit of the amplifier 1086. The opposite end of potentiometer 1096 as described hereinabove is coupled through resistor 1102 along line 1104 to the output of the MUX 1038. Node 1082 couples the output current signal representing the test waveform that is injected into the summing point 1020 at the neutral conductor load terminal of the circuit breaker under test 1000. The anode of a clamp rectifier 1106 is coupled to node 1082 and the cathode of a clamp rectifier 1108 is also coupled to node 1082. The other terminals of each of these clamp diodes 1106 and 1108 are coupled to the ground in the test circuit. Clamp rectifiers 1106 and 1108 keep the voltage at the summing point 1020 from rising too high when the circuit breaker contacts open and may each include a pair of rectifiers such as type 6A4M8 (not shown) connected in series.

In operation, the test waveform is stored in digitized form in the waveform library 1028 and made available to controller 1022 by PC 1024 according to a routine to be described hereinbelow. The test waveform is coupled sample by sample along the bus 1024 to the DAC 1032 and therealong to MUX 1038 via line 1174 during an internal controlled by controller 1022. The DAC 1032 converts the succession of digitized samples to an analog waveform which is supplied along line 1104 through resistor 1102 and a portion of it is applied to the positive input of amplifier 1086 from the wiper of potentiometer 1096. In amplifier 1086, the test waveform is amplified to a current level further regulated by variable resistor 1088 to a suitable level for injection into the summing point at node 1020.

Continuing with FIG. 10, the command signal current source 1110 will now be described. An amplifier 1112 has a negative input coupled to a node 1130, a positive input coupled to ground and an output coupled to a node 1118. Node 1118 is coupled to the base of an NPN transistor 1114 and also to the base of a PNP transistor 1116. Transistors 1114 and 1116 provide an inverting buffer that supplies the current drive necessary to drive the command signal into the summing point 1020. The emitters of transistors 1114 and 1116 are coupled together at a node 1120. The node 1120 is coupled through a resistor 1132 to the node 1130. The node 1120 is also coupled through a resistor 1122 to the node 1118. The collector of NPN transistor 1114 is coupled through a resistor 1124 to the plus 5 volt supply. Similarly, the collector of PNP transistor 1116 is coupled to a resistor 1126 to the negative 5 volt supply. The node 1130 which is coupled to the negative input of amplifier 1112 is coupled through a resistor 1134 to the minus 5 volt supply. The node 1130 is also coupled from the output 1138 of MUX 1038 through a resistor 1136. In operation, a binary encoded command waveform supplied from an output 1174 of DAC 1032 via MUX 1038 along output 1138 is provided to the negative input of the amplifier 1112 at node 1130. This amplifier provides the drive to transistors 1114 and 1116 for boosting the current of the signal so that it can drive the summing point at node 1020 into the neutral conductor circuit of the circuit breaker under test 1000. In this illustrative embodiment, the command signal is configured as on and off bursts of a sinusoidal signal which relates a duration of each burst to the period of a particular bit in a binary signal to be described further hereinbelow.

Continuing with FIG. 10, the high frequency current source 1140 as configured in this illustrative example will now be described. In certain applications, the test waveform that is required to perform a test of the circuit breaker under test 1000 must contain substantial high frequency content. Therefore, a separate arbitrary waveform generator is configured as a high frequency current source 1140 to provide the higher bandwidth required for such a test signal. The sequence of digitized samples is supplied as before from PC 1024 via controller 1022 along the bus 1034 to the input of a highspeed DAC 1036 which converts the train of digitized samples to an analog waveform along output 1168. The output of DAC 1036 is coupled through resistor 1166 to the positive input of the amplifier 1142. The output of amplifier 1142 is coupled through a zener rectifier 1162 to a node 1152 which is connected to the base of an NPN transistor 1146. Node 11 52 is coupled to a negative 10 volt supply through a resistor 1154. The emitter of NPN transistor 1146 is coupled to the negative 10 volt supply through a resistor 1156 and also to a node 1158 which is coupled to ground through a resistor 1160. The collector of NPN transistor 1146 is coupled to the collector of PNP transistor 1144 and the base of transistor 1144 is coupled to a positive two volt supply through a node 1148 which is also coupled to ground through a capacitor 1150. The emitter of PNP transistor 1144 is coupled to a positive ten volt supply through a resistor 1176. The output of the high frequency current source 1140 is provided at the junction of the collector terminals of PNP transistor 1144 and NPN transistor 1146 at a node 1164. Node 1164 is coupled to the summing point at node 1020 to provide the high frequency current source output signal when required by the particular test routine being conducted by the test circuit of FIG. 10. The high speed DAC 1036 which provides for converting the digitized samples to analog form is controlled by a clock signal along a line 1170 to an input to the high speed DAC 1036. This clock signal is typically, in this illustrative example, greater than or equal to eight times the frequency of the test waveform which will be output from the high frequency current source 1140.

Figure 11:
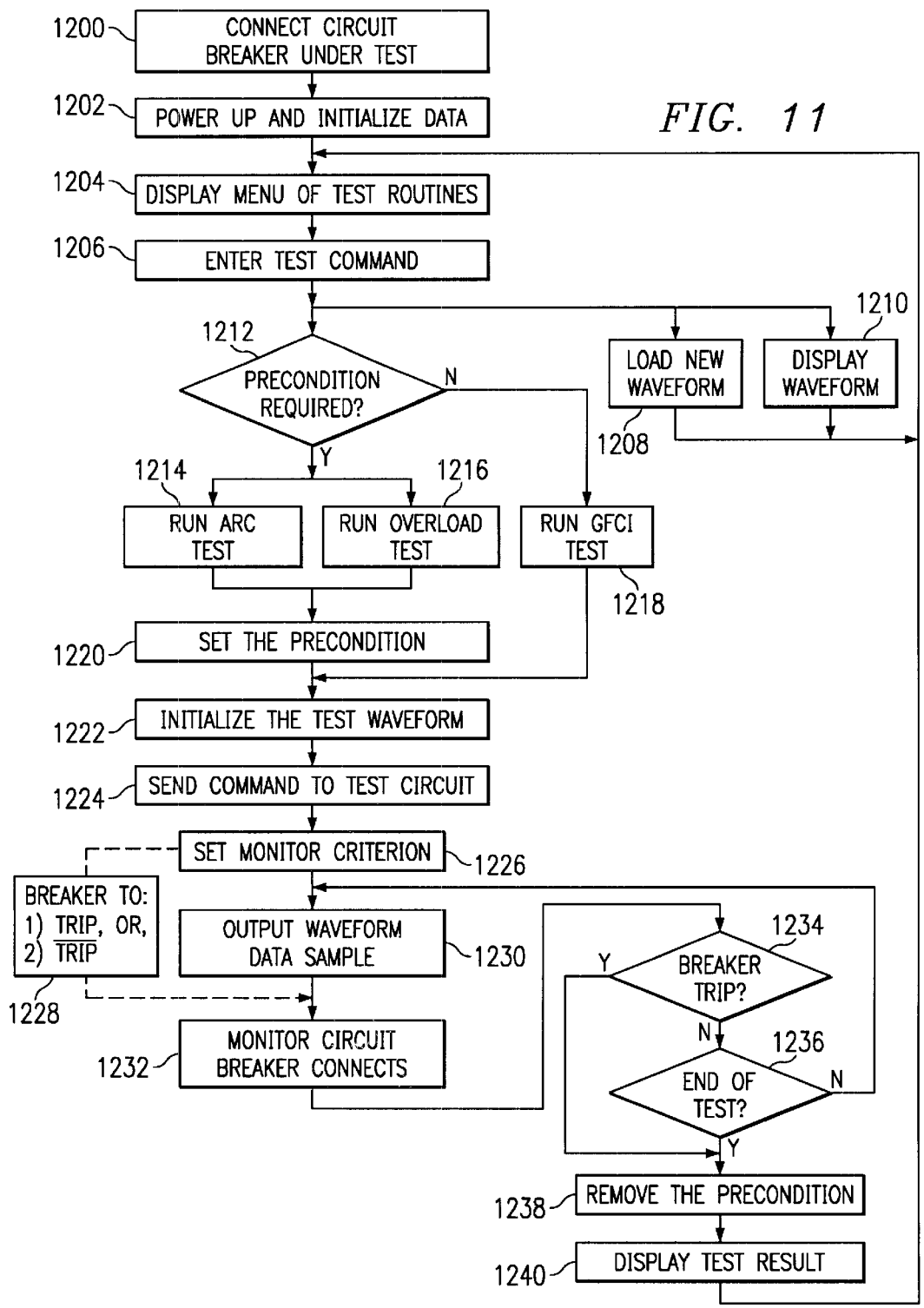
FIG. 11 illustrates a flowchart of the operation of the test circuit of FIG. 10 operating under the control of a PC.

Referring now to FIG. 11, there is illustrated a flowchart of the operation of the illustrative test circuit of FIG. 10 operating under the control of the PC 1024. The flow begins at step 1200 to connect the circuit breaker under test to the test circuit followed by step 1202 to power up and initialize data registers of the PC 1024. The flow then proceeds to step 1204 wherein the PC displays a menu of the test routines for use by the operator in selecting the particular test to run on the circuit breaker under test 1000 that is connected to the test circuit. The menu may include, e.g., which key on a keyboard (not shown) connected to the PC 1024 is associated with a particular function in the menu. Upon making a selection, the operator in step 1206 enters a test command corresponding to the selected test routine to which the PC 1024 responds by beginning executing the particular selected routine. It will be appreciated that the test command may also be received from the PC 1024 via an RS-232 communication link or other signal bus.

FIG. 11 illustrates several possible routines that may be selected and it will be appreciated that these are just a few of the wide variety of routines that may be provided, illustrating how such routines might be utilized within a particular application of the test circuit and method disclosed herein. The flow proceeds from block 1206 to a block 1208, for example, to load a new waveform into the PC 1024. Loading new data into a PC is well understood in the art and will not be described further herein although such an action would involve more steps than are illustrated in FIG. 11 but which are represented by step 1208. Upon the completion of such a process in step 1208, the flow returns to the input side of block 1204 to again display the menu of test routines which would then include, for example, an item identifying the new waveform previously loaded. Another test command that would be entered at step 1206 might be a command to display a waveform as indicated in step 1210. Again, this process may represent several steps which are included in step 1210 in FIG. 11 and which when completed would return to the step 1204 to display the menu of test routines.

Returning to step 1206 of FIG. 11, if a test command being entered was for a particular test then the flow proceeds to decision block 1212 where a determination is made as to whether a precondition for the selected test is required. A precondition in this application refers to whether the circuit breaker under test needs to be signaled about the particular test so that it may configure itself appropriately. If the determination is affirmative, then the flow proceeds along the "Y" path to begin the particular test. In this illustrative example, for the testing of an AFCI/GFCI circuit breaker, it is necessary to disable the ground fault detection portion of the circuit breaker while the arc fault detection portion of the circuit breaker is being tested. This is because with the particular combination of features and in the circuit breaker illustrated, both the arc fault sensor and the ground fault sensor respond to differential currents. Therefore it will be necessary, through a technique known as ground fault programming, to disable the ground fault sensor during the testing of the arc fault sensor and the detection circuitry responsive thereto. Ground fault programming refers to making use of the ground fault sensor and detection circuitry to signal the circuit breaker regarding some aspect of the test that is to be performed. In this way the circuit breaker electronics may be configured or programmed for a particular test. By sending commands through the neutral wire it is not necessary to provide a special communication link to access the internal circuitry of the circuit breaker under test 1000. Such a precondition might thus be required, for example, when running an arc test that is injecting a simulated arc fault waveform or also when running a current overload test which utilizes the same circuitry. Thus block 1214 represents the beginning of the arc fault test and block 1216 represents the beginning of a current overload test. In each case, the process is initiated by setting the precondition in block 1220 which in this case is to disable the ground fault detection apparatus for the duration of the arc fault or current overload test to be conducted. If, in block 1212 the precondition is not required, then the flow proceeds along the "N" path to block 1218 to begin running the ground fault circuit interrupting test which bypasses the step of setting a precondition in block 1220 and proceeds directly to block 1222 to initialize the particular test waveform that will be used in the test. The step 1222 to initialize the waveform may include such operations as loading the waveform data into RAM from the waveform library 1028, scaling the data and loading it into a buffer and loading a counter with the number of data samples for use in decision block 1236 to be described hereinbelow. It will be appreciated by those skilled in the art that this portion of the flowchart in FIG. 11 beginning with block 1212 may be organized in a variety of ways and it would not be limited to the particular sequence of operations that is shown. For example, the preconditioning determination may be made after a particular test is commenced and may be a part of each test rather than being a branch point between several types of tests that would be run on the particular circuit breaker. As another alternative, the set precondition step 1220 could be relocated to immediately follow step 1212. Further, the test waveforms may be scaled in block 1222 either as to amplitude or as to time.

Continuing now with FIG. 11, following the set precondition step 1220, in this case disabling the ground fault circuit detection apparatus, the flow proceeds to block 1222 to initialize the particular test waveform in the PC 1024. Step 1222 is followed by, in step 1224, sending a command to the test circuit controller 1022 to begin the test routine. The flow then proceeds to block 1226 in the PC 1024 to set the monitoring criterion, that is, to inform the controller 1022 how it is to interpret the signal from the open contact detector 1046. Referring to FIG. 10, the signal received from the open contact detector 1046 comprises a logic high level unless the open contact detector 1046 has detected an open contact condition. In the case of an open contact condition the signal at node 1074 will change from a logic high to a logic low. The monitoring function of controller 1022 must be set to respond to the open contact condition either by tripping the circuit breaker under test 1000 or by not tripping the circuit breaker under test 1000. This criterion which is represented by block 1228 thus provides the basis for a particular response in a later step to be described hereinbelow.

Returning to block 1226, after setting the monitoring criterion, the flow proceeds to block 1230 wherein the controller 1022 outputs a data sample of the particular waveform that has been selected corresponding to the selected test routine in block 1230. The flow then proceeds to block 1232 to monitor the circuit breaker contacts in the open contact detector 1046 followed by a decision block 1234. It will be appreciated in the foregoing that the test routine following the steps 1214, 1216 or 1218 runs through the same steps of the process, the only difference being whether a precondition was set and the particular waveform that was selected. The monitor circuit in step 1232 then responds to the signal from the open contact detector according to the monitor criterion set in step 1228 and proceeds to make a determination in step 1234 whether or not the circuit breaker under test 1000 did or did not trip in response to the particular waveform. If the criterion was to not trip, then the flow proceeds along the "N" path to decision block 1236 where the process seeks to determine whether the end of the test has been reached and if the result is negative, then the flow returns along the "N" path to the entry of step 1230 to output the next waveform data sample. This loop, consisting of steps 1230, 1232, 1234 and 1236 continues until all of the data samples for the particular waveform have been generated and injected into the summing point at node 1020 shown in FIG. 10. After the last sample has been sent, then the decision block 1236 determines that the end of the test has been reached and returns on the "Y" path to a step 1238 to remove the precondition if one was set. Returning to step 1234, if the monitor criterion set in step 1226 and represented in 1228 was to trip the breaker in the event of a particular test waveform condition, then the flow proceeds along the "Y" path to step 1238 to remove the precondition from the circuit breaker under test 1000 and proceed to step 1240 to display the test result. Upon displaying the test result, the flow then proceeds to step 1204 to again display a menu of test routines to run another test. It will be understood that since this program is operated by a PC that access to a printer (not shown) to printout the test results or apparatus (not shown) to otherwise store the results for later use may be utilized.

Figure 12:
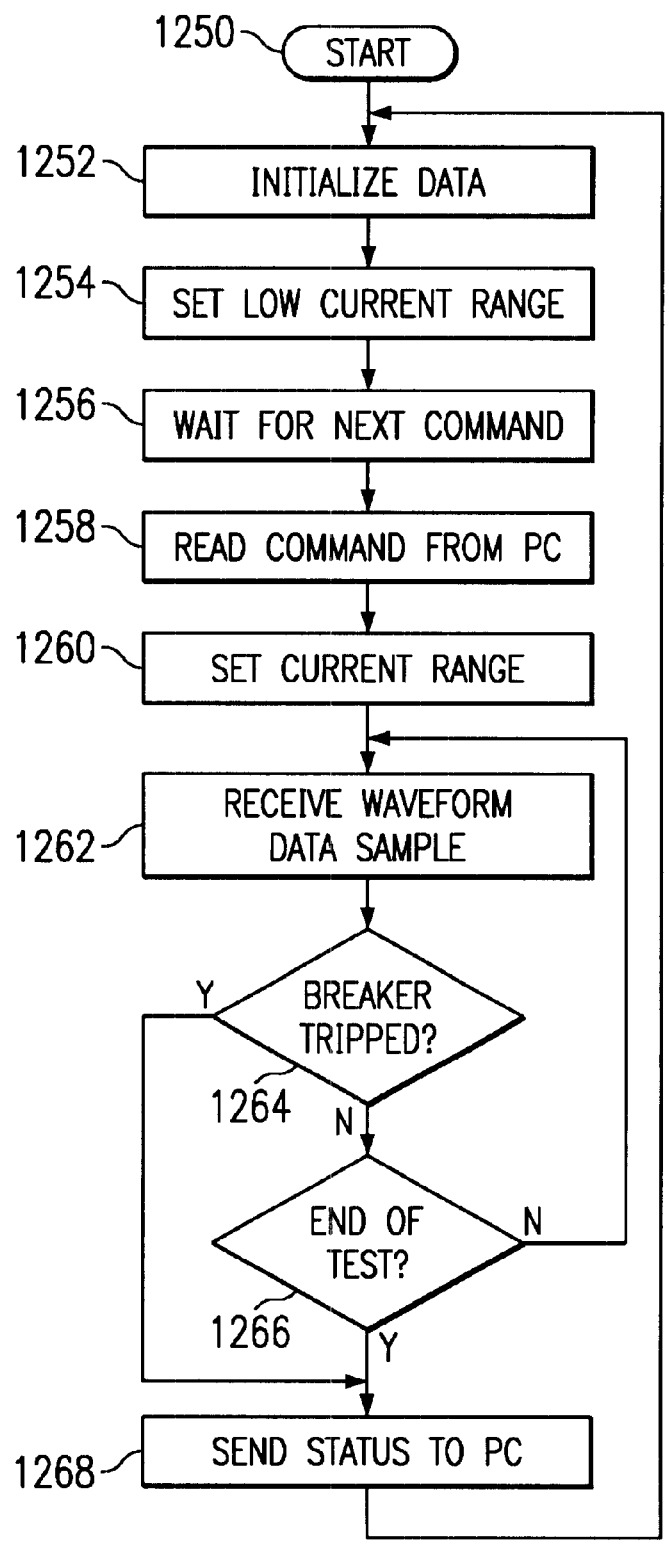
FIG. 12 illustrates a flowchart of the operation of the controller in the test circuit of FIG. 10.

Referring now to FIG. 12, there is illustrated a flowchart for the operation of the controller 1022 in the test circuit illustrated in FIG. 10. The routine starts in step 1250 and proceeds to initialize data in the registers of the controller 1022 in step 1252. After initializing the data, the flow proceeds to step 1254 wherein the controller sets the test circuit to the low current range—a default setting—at the power up. In the particular illustrative example shown in FIG. 10, the test circuit is configured to generate test waveforms in either of two ranges of current amplitude which in this case are termed low current range and high current range. Thus in step 1254 the test circuit defaults to the low current range during power up by counting the DAC 1032 as though it were being set for the low amplitude range. Following the initialization, power up and setting up of the low current range in steps 1252 and 1254, the controller 1022 executes a loop routine as it awaits the next command from the PC 1024 in step 1256. The command, read during step 1258 then begins the test routine in the controller 1022 by setting the current range or amplitude of the particular arbitrary waveform generator in the test circuit in step 1260. When the current range is selected either by remaining in the low range or switching to the high range, then the test circuit begins receiving waveform data samples from the PC 1024 in step 1262. The next two steps, 1264 and 1266 perform the same loop routine that was described in FIG. 11, that is to first determine whether the breaker has tripped and second, whether the end of the test has been reached, this loop continuing until all of the data samples of the particular waveform being used for the test have been received an generated. It will be appreciated that in the illustrative test circuit of FIG. 10, the data samples of the waveform are received in sequence, one after another, which in the aggregate comprise and are converted to analog form for injection into the summing point at node 1020. If the breaker is to trip in a particular test, then the flow from decision block 1264 proceeds along the "Y" path to a step 1268. If, however, the breaker did not trip in step 1264, then the flow proceeds along the "N" path to decision step 1266 wherein a determination is made as to whether the end of the test has been reached. The end of test may be indicated either by reaching a timeout or reaching an overflow condition of a counter in this illustrative example. If the end of test has been reached then the flow proceeds along the "Y" path to the step 1268. If, on the other hand, the end of test has not been reached, then the flow follows the "N" path back to the entry of the step 1262 where the next waveform data sample is received and sent to the arbitrary waveform generator circuitry to produce the test waveform injected at the summing point at node 1020. In the event that the circuit breaker has tripped or the end of the test has been reached, then the flow proceeds to the step 1268 wherein the controller 1022 sends the status of the test, which is determined by monitoring the output of the open contact detector 1046, to the PC 1024. The flow then returns to the entry point of the routine illustrated in FIG. 12 which is to initialize the data for the next test in step 1252.

Figure 13A:
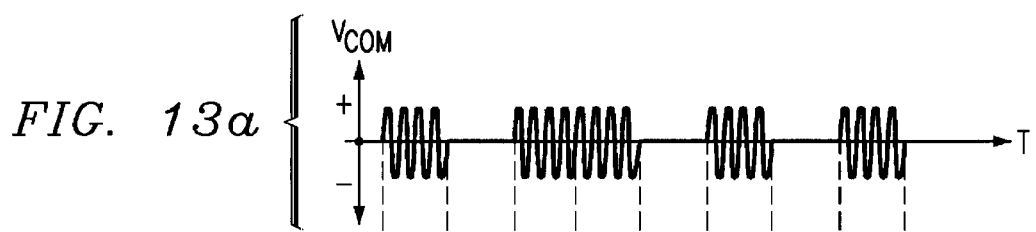
FIG. 13a illustrates a command signal waveform generated in the test circuit of FIG. 10.
Figure 13B:
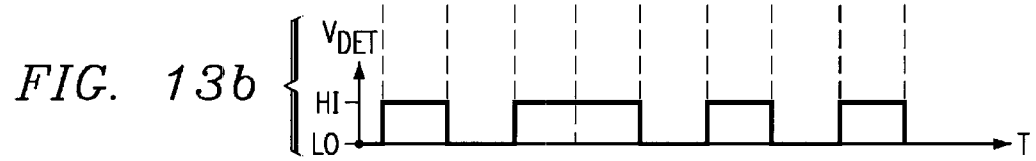

Referring now to FIG. 13*a*, there is illustrated a command signal waveform $V_{com}$ that is generated in the command signal current source 1110 portion of the test circuit illustrated in FIG. 10. This command signal typically has an amplitude of a few milliamps which will be sensed by the ground fault sensor in the circuit breaker under test 1000. The command signal contains a code sequence that will be interpreted, for example, by the circuit breaker under test 1000 as a command for setting a diagnostic mode in or preconditioning a portion of the circuit breaker under test to prepare it to respond appropriately to the test waveform that will be injected following the receipt of the command signal by the circuit breaker under test. The coding protocol associated with the command waveform in this illustrative example is shown in FIG. 13*a* consisting of several bursts of a sinusoid waveform for predetermined intervals such that a burst of several cycles of this sinusoid signal signifies a logic one and the absence of a burst of several cycles signifies a logic zero. This signal is generated in the controller 1022 supplied along a bus 1040 to MUX 1038 and therealong output line 1138 from the MUX 1038 through resistor 1136 to the input to the command signal current source amplifier 1112. As described hereinabove regarding FIG. 9 a typical output binary pattern from the command signal current source 1110 may include an equal number of ones and zeros to eliminate offset effects caused by the AC coupling of the ground fault sensing transformer 1010. When the command signal is injected into the neutral conductor line within the circuit breaker under test 1000, this signal is sensed by the ground fault sensor and interpreted by the circuit breaker electronics 1012 to be a sequence of ones and zeroes corresponding to the presence or absence of a burst of the sinusoidal signal waveform. This corresponding binary signal $V_{det}$ is illustrated in FIG. 13*b*. The signal $V_{det}$ is read by decoding circuitry within the circuit breaker electronics. In this illustrative example the command signal is interpreted to disable the ground fault sensing detection circuitry for a short period of time (on the order of a second or two) while the test waveforms are injected via the summing point at node 1020. It will be appreciated that this method of sending commands through the neutral wire to the circuit breaker under test provides a practical way to access and/or program the internal circuitry of the circuit breaker under test as an integral part of the testing process. Thus, when devising a test sequence, the program developed to be executed by the PC 1024 may be configured to utilize the controller 1022 in the test circuit as well as any of the test circuitry in the test circuit. One need only send command signals to the circuit breaker under test 1000 along with the desired kinds of test waveforms in order to test the circuit breaker under a variety of conditions. The programs and circuits described herein are meant to be illustrative and not limiting as to the kinds of modes of testing which may be performed using the processes and structures that are illustrated in the present disclosure.

Test Waveforms

Arcing phenomena in power circuits occur in a wide variety of forms and circumstances. One of the objectives of comprehensive circuit breaker testing is to evaluate the performance of a circuit breaker under realistic or actual conditions, to find out whether it responds appropriately to particular kinds of current fault, arc fault or ground fault conditions. A variety of possible test waveforms may be utilized for this purpose all of which may be stored in digitized form in the waveform library 1028 illustrated in FIG. 10. Associated with each of these test waveforms may be a monitoring criterion for determining whether or not the breaker under test 1000 must trip in the presence of such a waveform or must not trip in the presence of such a waveform. This criterion is related to the aforementioned distinction made between hazardous and non-hazardous waveform conditions. For example, some hazardous conditions may include loose wiring connections in outlets or switches; loose wires twisted together and held by a wire nut; or frayed cords on appliances. Such conditions represent fire hazards in that any combustible material that is near the arcing event may be ignited by the arc and present a serious fire hazard. On the other hand, a number of non-hazardous conditions are typically found in which it would not be necessary to trip the circuit breaker and should thus be ignored. Such non-hazardous conditions may include toggling a power switch, plugging in an appliance, replacing a light bulb, an impending failure of a light bulb or the switching of a motor relay to start a large motor or a compressor in an air conditioner or a refrigerator, for example. Some arcing under these conditions is normal and occurs in a place where combustible materials are not present and thus should normally not represent a hazardous condition requiring the tripping of a circuit breaker. Some examples of test waveforms suitable for testing both hazardous and non-hazardous conditions will be described in conjunction with FIGS. 14–17.

Figure 14:
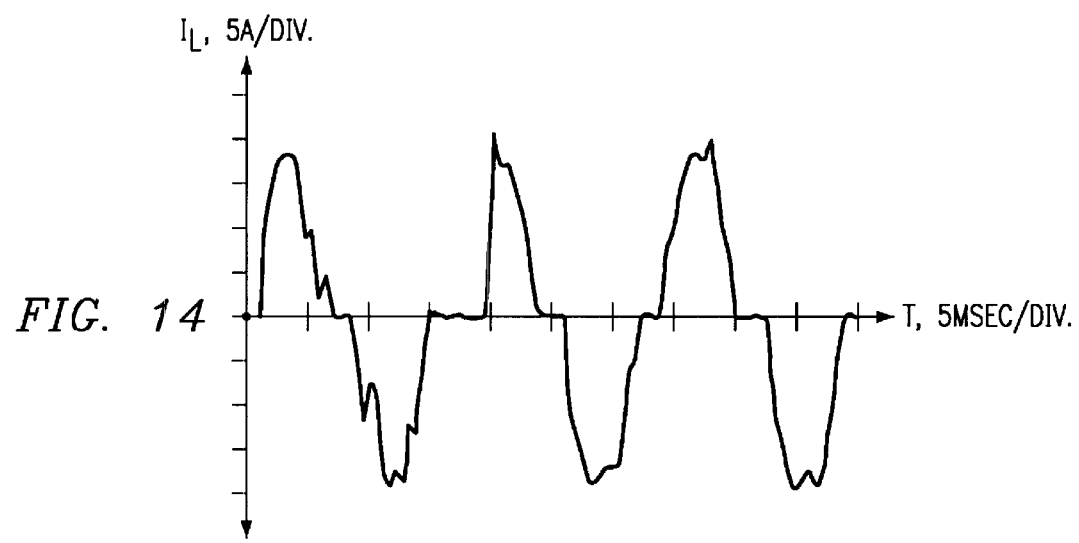
FIG. 14 illustrates a signal generated from a digitized current waveform corresponding to arcing produced by a loose wire.
Figure 15:
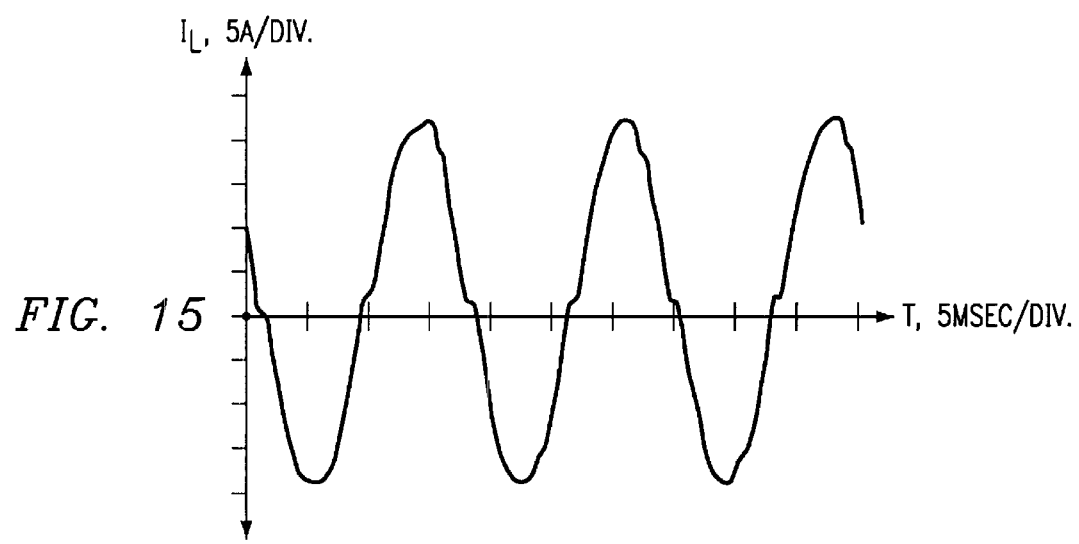
FIG. 15 illustrates a signal generated from a digitized current waveform corresponding to arcing between two carbon rods.
Figure 16:
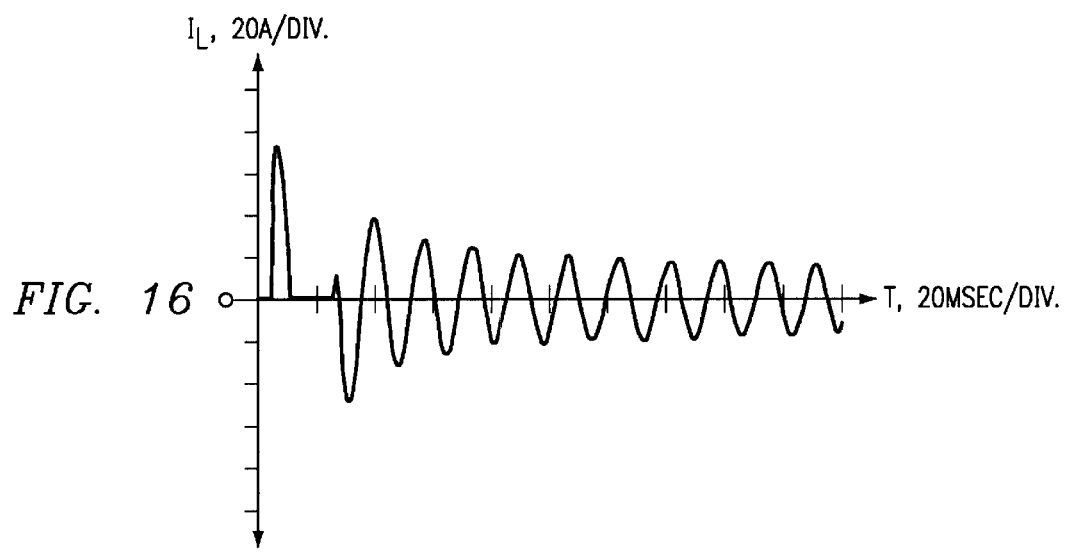
FIG. 16 illustrates a signal generated from a digitized current waveform corresponding to arcing produced by turning on a group of incandescent lamps with a knife switch.
Figure 17:
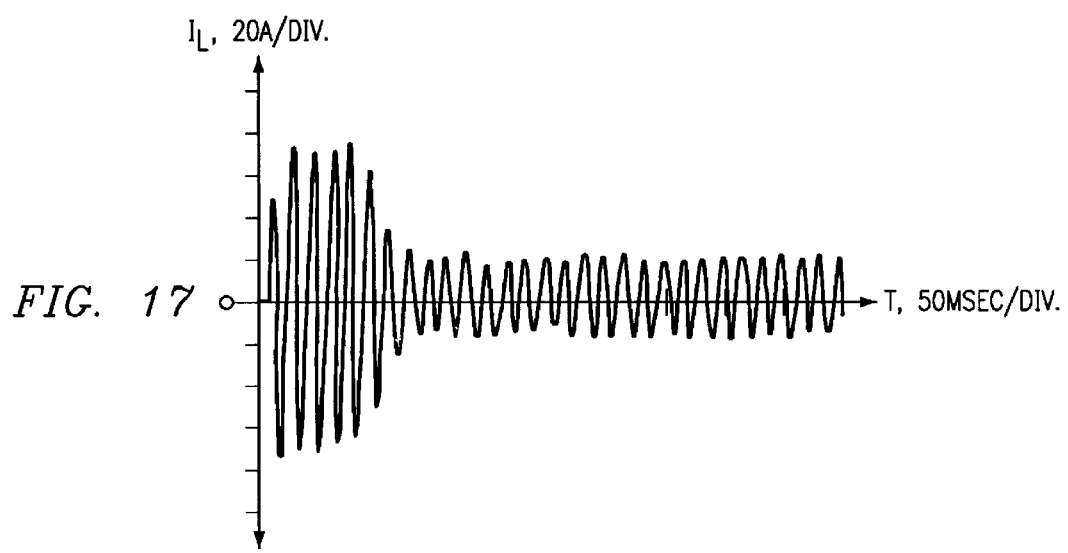
FIG. 17 illustrates a signal generated from a digitized current waveform corresponding to the transient waveform produced during the startup of a one horsepower air compressor.

A key aspect of the present disclosure is to provide for a testing process that utilizes test waveforms derived from actual arc and transient measurements that occur under real conditions on a typical residential power line. A library of test waveforms has been developed and refined for use in the circuit breaker testing device and method disclosed herein. FIGS. 14, 15, 16 and 17 illustrate some representative test waveforms that are derived from actual measurements, digitized and stored within the waveform library 1028 shown in FIG. 10. The waveforms illustrated in FIGS. 14 and 15 represent hazardous conditions in which it is intended, that the circuit breaker under test 1000 respond by opening the separable contacts within the circuit breaker. FIGS. 16 and 17 represent several non-hazardous conditions in which it is intended that the circuit breaker under test 1000 respond by not tripping the separable contacts within the circuit breaker under test 1000. All of the waveforms illustrated in FIGS. 14 through 17 are scaled down versions of actual test waveforms obtained under real conditions.

The scaling factor used in the illustrative example disclosed herein is approximately 10 to 1; so, if in one of the illustrated waveforms the peak amplitude of the current appears to be, for example, 15 amperes, then it represents a 150 ampere peak amplitude that occurred under real conditions. This scaling is performed in order to bring the amplitudes of the digitized test waveforms within the normal operating range of the current sensing differential transformers utilized within the circuit breaker under test 1000. In addition to the peak amplitude of the particular phenomenon represented by these illustrative test waveforms, the duration of the arc event provides important information that may be utilized to determine whether nor not the arc event is a hazardous arc or is a non-hazardous arc. By examining the four waveforms illustrated in FIGS. 14 through 17 it can be appreciated that the amplitude of the hazardous arcs in FIGS. 14 and 15 represent continuous phenomena having a high peak amplitude and therefore represent a hazardous condition. On the other hand, the waveforms illustrated in FIGS. 16 and 17 may have an initial high amplitude peak value for only a short period of time before decaying rapidly (within a few cycles) to a much lower value which amplitude, if continuous, is within the handle rating or the current trip rating of the circuit breaker under test 1000. So the transient events associated with the early portions of the test waveforms illustrated in FIGS. 16 and 17 represent normal transient behavior and are not likely to pose a hazardous condition. In addition, the waveform of FIGS. 16 and 17 represent normal behavior with equipment in good operation condition, factors which may be inferred from inspecting the particular waveforms.

Referring now to FIG. 14, there is illustrated a signal generated from a digitized current waveform corresponding to arcing produced by a loose wire in a branch circuit of a residential power distribution system. The waveform has high peak amplitudes and is characterized by intermittent connections and erratic current values as indicated by the discontinuities and the pronounced high frequency signal content that is visible in the waveform curve. This waveform is typical of the kind of hazardous high current arc that may be produced when there is a loose connection in a circuit that feeds a high current load. Due to the intermittent nature, this current waveform may or may not trip a normal breaker connected in the circuit particularly when the proportion of open connection conditions exist for a substantial portion of the time during which the loose connection persists.

Referring now to FIG. 15, there is illustrated a signal generated from a digitized current waveform corresponding to arcing between two carbon rods to simulate the kind of high current arc which may occur between two phases of a power line or between a phase and ground of a power line. Such an arc is representative of a parallel arc involving considerable current and considerable heating of adjacent structures or materials.

Referring now to FIG. 16, there is illustrated a signal generated from a digitized current waveform corresponding to arcing produced by turning on a group of incandescent lamps with a knife switch. This is not an uncommon situation and the waveform shown in FIG. 16 illustrates both the high amplitude inrush current that is typical of incandescent lamps having resistive filaments that have a very low resistance when cold but rapidly increase their resistance upon being heated by the current flowing within the filaments. The waveform in FIG. 16 also illustrates the effects of switch bounce, which is a common phenomenon in many circuits. The switch bounce phenomenon is repeatably simulated by use of a knife switch. The waveform includes the arcing or transient current which occurs at the beginning of the closure of the knife switch, showing the initial high peak transient values which decay rapidly to a steady state value. This example even includes a brief duration period when the connection is actually open and prevents the flow of any current in the circuit. Switch bounce is a typical phenomenon in many circuits and thus in the form illustrated in FIG. 16 does not represent a hazardous condition. Therefore the circuit breaker under test 1000 will be expected to not trip in the presence of such a waveform.

Referring now to FIG. 17, there is illustrated a signal generated from a digitized current waveform corresponding to the transient waveform produced during the startup of a one horsepower air compressor. Again, this waveform is characterized by relatively high initial peak current amplitudes which rapidly decay to a continuous, much lower level amplitude current drawn by the compressor in this example. Here again, there is no hazardous condition represented in the current of this waveform, merely a relatively high amplitude peak value for several cycles before its decay to the nominal amplitude of the current required by the compressor. Thus, the circuit breaker under test 1000 when presented with this test waveform applied to the neutral conductor would be expected to not trip in the presence of this test waveform.

Although the preferred embodiment has been described in detail, it should be understood that various changes, substitutions and alterations can be made therein without departing from the spirit and scope of the invention as defined by the appended claims.

What is claimed is:

1. A method for testing an electronically activated circuit breaker having source and load terminals and separable contacts disposed in the line and neutral conductors of the power line and further having arc fault and/or ground fault interrupting capability responsive to differential currents in the line and neutral conductors wherein the circuit breaker under test is connected in a test circuit, comprising the steps of:

supplying operating power to the source terminals of the circuit breaker wherein the test circuit provides for connecting the neutral conductor source terminal to a ground in the test circuit;

coupling testing signals from a test generator in the test circuit to the neutral conductor load terminal of the circuit breaker; and monitoring the condition of the separable contacts in the circuit breaker following the supplying of testing signals to the neutral conductor load terminal.

2. The method of claim 1, further comprising the step of:

operating the test generator under programmed control to provide a testing signal sequence to the neutral conductor load terminal of the circuit breaker.

3. The method of claim 2, further comprising the step of:

providing a testing signal having command signal data followed by test waveform data.

4. The method of claim 2, further comprising the step of:

providing a testing signal having a sequence of test waveform data.

5. The method of claim 4, wherein the step of providing comprises the step of:

associating a must-trip criterion with a first test waveform in the sequence; and associating a must-not trip criterion with a second test waveform in the sequence.

6. The method of claim 5, wherein the step of providing comprises the step of:

associating the must-trip criterion with the first test waveform.

7. The method of claim 5, wherein the step of providing comprises the step of:

associating the must-not trip criterion with the first test waveform.

8. The method of claim 4, wherein the step of providing comprises the step of:

associating a must-trip criterion with each test waveform in the sequence of test waveforms.

9. The method of claim 4, wherein the step of providing comprises the step of:

associating a must-not criterion with each test waveform in the sequence of test waveforms.

10. The method of claim 1, wherein the step of coupling testing signals comprises the step of:

generating the testing signals from a library of digitized test waveforms.

11. The method of claim 10, wherein the step of generating the testing signals comprises the steps of:

selecting a test sequence;

generating a testing command; and assembling the testing signal comprising the test sequence following the testing command.

12. The method of claim 11, wherein the step of selecting a test sequence comprises the step of:

specifying which test waveforms from the library are to be addressed and retrieved.

13. The method of claim 11, wherein the step of generating a testing command comprises the steps of:

determining whether preconditioning of the circuit breaker under test is required; and configuring the testing command to perform the required preconditioning of the circuit breaker under test.

14. The method of claim 13, wherein the step of configuring the testing command comprises the step of:

disabling a ground detection circuit if one is present in the circuit breaker being tested.

15. The method of claim 11, wherein the step of assembling the testing signal comprises the step of:

coupling a testing command signal from a low current source together with a test waveform signal from a high current source to a summing point for sending to the neutral conductor load terminal.

16. A method for testing an electronically activated circuit breaker having source and load terminals and separable contacts disposed in the line and neutral conductors of the power line and further having arc fault and/or ground fault interrupting capability responsive to differential currents in the line and neutral conductors wherein the circuit breaker under test is connected in a test circuit, comprising the steps of:

supplying operating power to the source terminals of the circuit breaker wherein the test circuit provides for connecting the neutral conductor source terminal to a ground in the test circuit;

coupling a test generator in the test circuit to the neutral conductor load terminal of the circuit breaker;

operating the test generator under programmed control to provide a testing signal sequence to the neutral conductor load terminal of the circuit breaker; and monitoring the condition of the separable contacts in the circuit breaker following the supplying of testing signals to the neutral conductor load terminal.

17. The method of claim 16, further comprising the step of:

providing a testing signal having command signal data followed by test waveform data.

18. The method of claim 16, further comprising the step of:

providing a testing signal having a sequence of test waveform data.

19. The method of claim 18, wherein the step of providing comprises the step of:

associating a must-trip criterion with a first test waveform in the sequence; and associating a must-not trip criterion with a second test waveform in the sequence.

20. The method of claim 19, wherein the step of providing comprises the step of:

associating the must-trip criterion with the first test waveform.

21. The method of claim 19, wherein the step of providing comprises the step of:

associating the must-not trip criterion with the first test waveform.

22. The method of claim 18, wherein the step of providing comprises the step of:

associating a must-trip criterion with each test waveform in the sequence of test waveforms.

23. The method of claim 18, wherein the step of providing comprises the step of:

associating a must-not trip criterion with each test waveform in the sequence of test waveforms.

24. The method of claim 16, wherein the step of operating the test generator comprises the steps of:

selecting a test sequence;

generating a testing command for insertion in the test sequence preceding the first test waveform; and sending the completed testing signal sequence to the neutral conductor load terminal of the circuit breaker under test.

25. The method of claim 24, wherein the step of selecting a test sequence comprises the steps of:

specifying which test waveforms from a library of digitized waveforms are to be addressed and retrieved.

26. The method of claim 24, wherein the step of generating a testing command comprises the steps of:

determining whether preconditioning of the circuit breaker under test is required; and configuring the testing command to perform the required preconditioning of the circuit breaker under test.

27. The method of claim 24, wherein the step of sending comprises the step of:

coupling a testing command signal from a low current source together with a test waveform signal from a high current source to a summing point for sending to the neutral conductor load terminal.

28. The method of claim 26, wherein the step of configuring the testing command comprises the step of:

generating a logic level one comprising a sine wave burst of specified duration and a logic level zero comprising the absence of a sine wave burst of the specified duration.

29. The method of claim 16, wherein the step of monitoring comprises the steps of:

comparing the voltage at the neutral conductor load terminal with a reference; and indicating the result of the monitoring step.

30. The method of claim 16, wherein the step of monitoring comprises the steps of:

determining whether the neutral conductor load terminal is grounded; and indicating the result of the monitoring step.

* * * * *